US011623853B2

(12) United States Patent
Kil et al.

(10) Patent No.: US 11,623,853 B2
(45) Date of Patent: Apr. 11, 2023

(54) FLUID SUPPLY APPARATUS AND SUBSTRATE PROCESSING APPARATUS INCLUDING THE SAME

(71) Applicant: Samsung Electronics Co., Ltd., Suwon-si (KR)

(72) Inventors: Kibeom Kil, Asan-si (KR); Dongsoo Lee, Cheonan-si (KR); Wooram Oh, Asan-si (KR); Sangho Jang, Cheonan-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/583,653

(22) Filed: Jan. 25, 2022

(65) Prior Publication Data

US 2022/0396380 A1 Dec. 15, 2022

(30) Foreign Application Priority Data

Jun. 14, 2021 (KR) .................. 10-2021-0077000

(51) Int. Cl.
| | |
|---|---|
| *B67B 7/18* | (2006.01) |
| *B65B 3/14* | (2006.01) |
| *B65B 7/28* | (2006.01) |
| *B65B 3/18* | (2006.01) |

(Continued)

(52) U.S. Cl.
CPC ............... *B67B 7/182* (2013.01); *B65B 3/14* (2013.01); *B65B 3/18* (2013.01); *B65B 7/2835* (2013.01); *B67C 9/00* (2013.01); *H01L 21/67023* (2013.01)

(58) Field of Classification Search
CPC .. B67B 7/182; B65B 3/14; B65B 3/18; B65B 7/2835; B67C 9/00; H01L 21/67023
See application file for complete search history.

(56) References Cited

U.S. PATENT DOCUMENTS 3,987,535 A * 10/1976 Brown .................... B67B 7/182
29/773
6,168,048 B1 * 1/2001 Xu ......................... B67D 7/025
222/64

(Continued)

FOREIGN PATENT DOCUMENTS

| JP | 2000-254428 A | 9/2000 |
| JP | 2007-053158 A | 3/2007 |

(Continued)

*Primary Examiner* — Nicolas A Arnett
(74) *Attorney, Agent, or Firm* — Harness, Dickey & Pierce, P.L.C.

(57) ABSTRACT

A fluid supply apparatus includes a container supply holder configured to supply a container to a cap separator using a loading box, the container including a detachable nozzle cap, and configured to store a process fluid, a cap separator configured to receive the container from the loading box and separate the nozzle cap from a container body of the container using a cap clamper and a rotation actuator, the cap clamper configured to clamp and hold the nozzle cap, and the rotation actuator configured to rotate the container body, a fluid supplier configured to supply the process fluid contained in the container body through a fluid supply line, and a controller configured to control the container supply holder, the cap separator, and the fluid supplier.

20 Claims, 16 Drawing Sheets

(51) Int. Cl.
*B67C 9/00* (2006.01)
*H01L 21/67* (2006.01)

(56) References Cited

U.S. PATENT DOCUMENTS

| | | | | |
|---|---|---|---|---|
| 6,688,020 | B2* | 2/2004 | Toshima | H01L 21/67028 |
| | | | | 34/558 |
| 7,024,965 | B2* | 4/2006 | Tremblay | B67B 7/182 |
| | | | | 81/3.2 |
| 8,205,413 | B2* | 6/2012 | Kramer | G01N 35/04 |
| | | | | 53/367 |
| 9,038,855 | B2* | 5/2015 | Lurcott | B67D 7/0261 |
| | | | | 141/10 |
| 9,586,188 | B2* | 3/2017 | Lurcott | B67D 7/0261 |
| 9,744,613 | B2 | 8/2017 | Hiyama et al. | |
| 10,381,233 | B2* | 8/2019 | Kagawa | H01L 21/67023 |
| 10,695,713 | B2 | 6/2020 | Mizuoka et al. | |
| 2001/0050041 | A1* | 12/2001 | Reardon | H01L 21/6715 |
| | | | | 118/52 |
| 2005/0072358 | A1* | 4/2005 | Katsuoka | C25D 17/001 |
| | | | | 118/719 |
| 2015/0264790 | A1* | 9/2015 | Miyagi | G03F 1/82 |
| | | | | 378/66 |
| 2020/0282355 | A1 | 9/2020 | Hiyama | |
| 2021/0339995 | A1* | 11/2021 | Hsu | B67B 7/182 |

FOREIGN PATENT DOCUMENTS

| | | |
|---|---|---|
| JP | 2011-167731 A | 9/2011 |
| KR | 10-1770542 B1 | 8/2017 |

\* cited by examiner

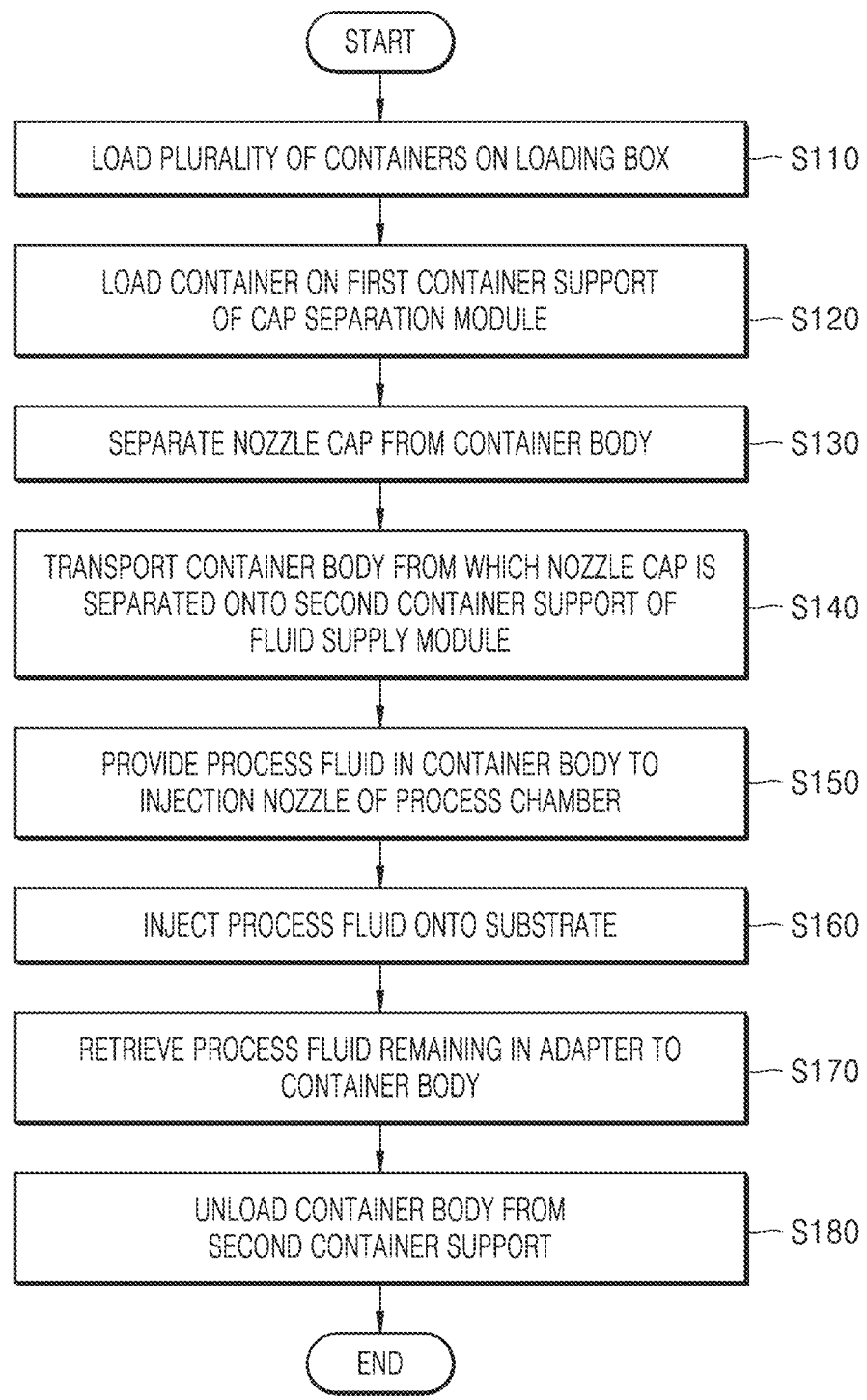

FLUID SUPPLY APPARATUS AND SUBSTRATE PROCESSING APPARATUS INCLUDING THE SAME

CROSS-REFERENCE TO RELATED APPLICATION

This U.S. non-provisional application is based on and claims the benefit of priority under 35 U.S.C. § 119 to Korean Patent Application No. 10-2021-0077000, filed on Jun. 14, 2021, in the Korean Intellectual Property Office, the disclosure of which is incorporated by reference herein in its entirety.

BACKGROUND

Various example embodiments of the inventive concepts relate to a fluid supply apparatus and/or a substrate processing apparatus including the same, etc.

A process fluid (for example, a chemical liquid, a process gas, etc.) used in a substrate processing process is carried to a fluid supply facility by being charged in a container. The fluid supply facility may mount the container thereon, and supply the process fluid in the container from the fluid supply facility to a chamber for processing a substrate through a fluid supply line extending between the fluid supply facility and the chamber for processing the substrate. Generally, a series of handling operations of the container including transportation and mounting of the container, etc., may be performed as manual operations by a human operator, and such operations of handling a heavy container may cause a risk of injury and/or damage to the operator.

SUMMARY

At least one example embodiment of the inventive concepts provides a fluid supply apparatus.

At least one example embodiment of the inventive concepts also provides a substrate processing apparatus including the fluid supply apparatus.

According to an aspect of at least one example embodiment of the inventive concepts, there is provided a fluid supply apparatus including a container supply holder configured to supply a container to a cap separator using a loading box, the container including a detachable nozzle cap, and configured to store a process fluid, a cap separator configured to receive the container from the loading box and separate the nozzle cap from a container body of the container using a cap clamper and a rotation actuator, the cap clamper configured to clamp and hold the nozzle cap, and the rotation actuator configured to rotate the container body, a fluid supplier configured to supply the process fluid contained in the container body through a fluid supply line, and a controller configured to control the container supply holder, the cap separator, and the fluid supplier.

According to another aspect of at least one example embodiment of the inventive concepts, there is provided a fluid supply apparatus including a container support configured to support a container, wherein the container includes a container body and a detachable nozzle cap, the container body configured to contain a process fluid, and the nozzle cap coupled to a front end portion of the container body, the front end portion of the container body having a nozzle portion, an adapter configured to support the front end portion of the container body, the adapter including a first fluid passage and a second fluid passage, the first fluid passage extending between the nozzle portion of the container body and an outlet connected to a fluid supply line, and the second fluid passage connected to the first fluid passage, a rear end frame configured to support a rear end portion of the container body, a plunger actuator configured to press a plunger included in the container body, and a residue retrieving air pump configured to provide pneumatic pressure to the second fluid passage of the adapter such that the process fluid remaining in the first fluid passage of the adapter is retrieved from the container body.

According to another aspect of at least one example embodiment of the inventive concepts, there is provided a substrate processing apparatus including a substrate stage configured to receive a substrate, an injection nozzle configured to inject a process fluid onto the substrate received on the substrate stage, and a fluid supply apparatus connected to the injection nozzle through a fluid supply line, the fluid supply apparatus configured to supply the process fluid through the injection nozzle, the fluid supply apparatus including, a container supply holder configured to supply a container to a cap separator using a loading box, the container including a detachable nozzle cap, and configured to store a process fluid, a cap separator configured to receive the container from the loading box and separate the nozzle cap from a container body of the container using a cap clamper and a rotation actuator, the cap clamper configured to clamp and hold the nozzle cap, and the rotation actuator configured to rotate the container body, a fluid supplier configured to supply the process fluid contained in the container body through a fluid supply line, and a controller configured to control the container supply holder, the cap separator, and the fluid supplier.

BRIEF DESCRIPTION OF THE DRAWINGS

Various example embodiments of the inventive concepts will be more clearly understood from the following detailed description taken in conjunction with the accompanying drawings in which:

FIG. 12 is a flowchart of a substrate processing method according to some example embodiments.

DETAILED DESCRIPTION

Figure 1:
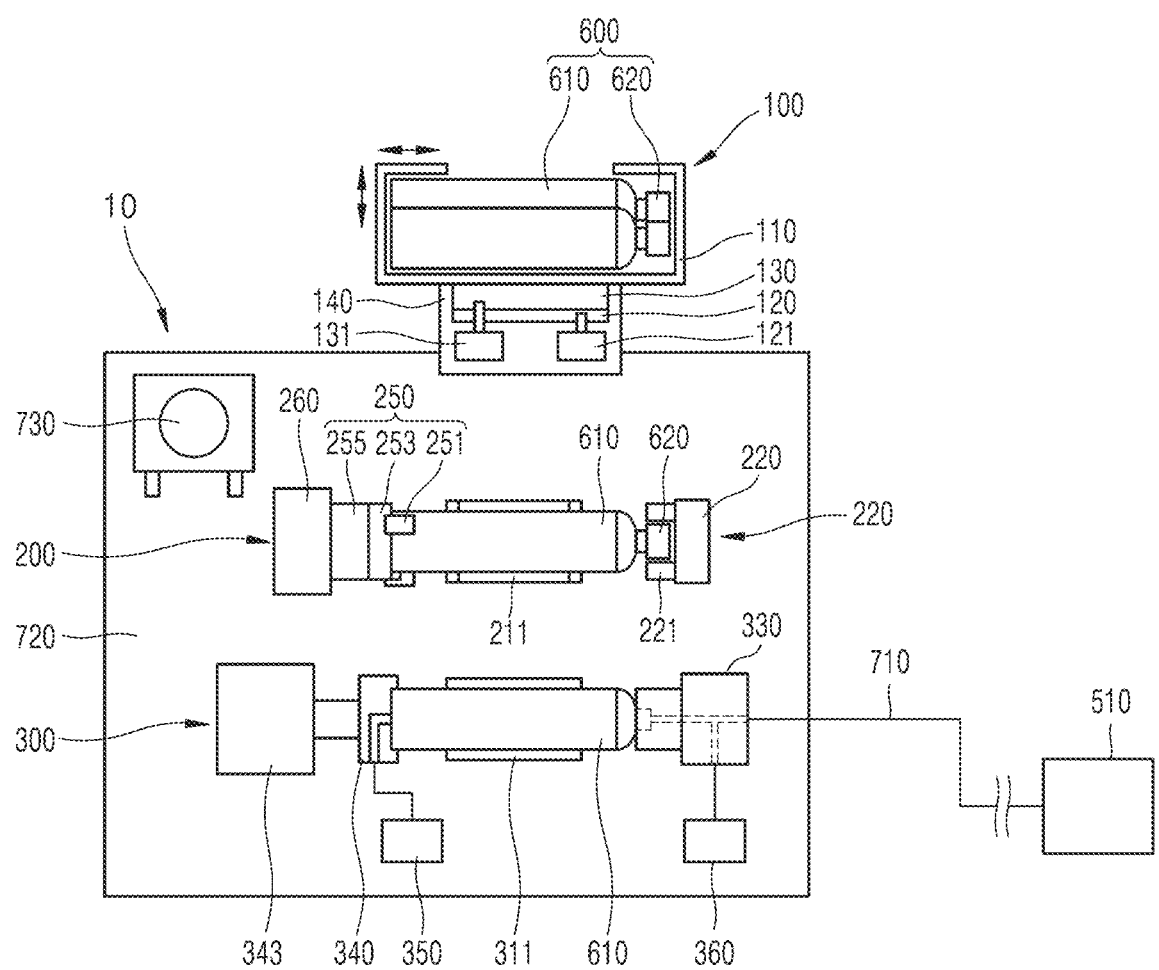
FIG. 1 is a schematic diagram of a fluid supply apparatus according to some example embodiments.

Hereinafter, various example embodiments of the inventive concepts are described in detail with reference to the accompanying drawings. For the same components on the drawings, the same reference numerals are used, and the same descriptions are not given.

Figure 2:
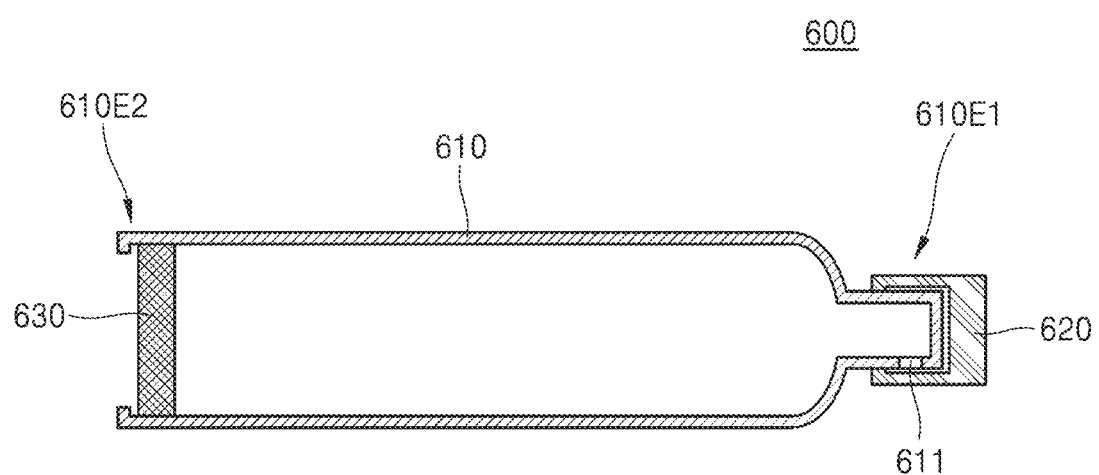
FIG. 2 is a schematic cross-sectional view of a container of FIG. 1 according to at least one example embodiment.

FIG. 1 is a schematic diagram of a fluid supply apparatus 10 according to some example embodiments. FIG. 2 is a schematic cross-sectional view of a container 600 of FIG. 1 according to at least one example embodiment.

Referring to FIGS. 1 and 2, the fluid supply apparatus 10 may be configured to receive the container 600 storing and/or accommodating a process fluid and supply the process fluid stored and/or accommodated in the container 600 to a process chamber 510. The fluid supply apparatus 10 may be configured to supply the process fluid to the process chamber 510 through a fluid supply line 710 extending between the fluid supply apparatus 10 and the process chamber 510.

The container 600 may accommodate various liquid chemicals, process gases, etc., for processing, for example, a semiconductor substrate, etc. According to some example embodiments, the container 600 may accommodate a flux, but is not limited thereto. As illustrated in FIG. 2, according to some example embodiments, the container 600 may include a container body 610 having and/or defining an inner space for accommodating and/or storing a process fluid and/or gas, and a nozzle cap 620 detachably coupled to the container body 610, etc., but is not limited thereto. The nozzle cap 620 may cover a nozzle portion 611 of the container body 610. The nozzle portion 611 may be configured to discharge the process fluid and/or process gas accommodated and/or stored in the container 600 and may be provided on a front end portion 610E1 of the container body 610, but the example embodiments are not limited thereto. The nozzle cap 620 may be, for example, coupled to the container body 610 by a screw joint, etc., but is not limited thereto, and other fastener types may be used. According to at least one example embodiment, a screw thread may be provided on the front end portion 610E1 of the container body 610, and a screw thread in gear with the screw thread of the container body 610 may be provided on an inner circumference of the nozzle cap 620, but the example embodiments are not limited thereto. A plunger 630 configured to be movable in a length direction of the container body 610 (that is, in a direction from a rear end portion 610E2 of the container body 610 to the front end portion 610E1 of the container body 610) may be provided in the container body 610, etc. When, in a state in which the nozzle cap 620 is detached from the container body 610, an external force is applied to the plunger 630 in a direction from the rear end portion 610E2 toward the front end portion 610E1 of the container body 610, the plunger 630 may move from the rear end portion 610E2 to the front end portion 610E1 of the container body 610, so that the process fluid and/or process gas accommodated in the container 600 may be discharged through the nozzle portion 611, etc.

The fluid supply apparatus 10 may include a container supply module 100 (e.g., a container supply holder, etc.), a cap separation module 200 (e.g., a cap separator, etc.), and/or a fluid supply module 300 (e.g., a fluid supplier, etc.), etc., but the example embodiments are not limited thereto, and for example, may include a greater or lesser number of constituent components. The cap separation module 200 and the fluid supply module 300 may be mounted on a stage 720, and the container supply module 100 may be configured to be movable above the cap separation module 200 and/or the fluid supply module 300, etc., but is not limited thereto.

The container supply module 100 (e.g., the container supply holder, etc.) may include a loading box 110 on which a plurality of containers 600 are loaded and may be configured to supply the container(s) 600 loaded on the loading box 110 to the cap separation module 200, etc. For example, the loading box 110 of the container supply module 100 may be configured to be movable in a horizontal direction (e.g., an X direction and/or a Y direction) and/or a vertical direction (e.g., a Z direction) via an additional transportation device, such as an actuator, a motor, etc. Hereinafter, the horizontal direction may be defined as a direction parallel to a supporting surface of the stage 720 on which the cap separation module 200 and the fluid supply module 300 are mounted, and the vertical direction may be defined as a direction perpendicular to the supporting surface of the stage 720. For example, the container supply module 100 may move the loading box 110 to a location in which an outlet (e.g., 110o of FIG. 3, etc.) of the loading box 110 is vertically (e.g., in the Z direction) aligned on a first container support 211 of the cap separation module 200, and then, may eject the container 600 through the outlet 110o of the loading box 110 such that the container 600 may be mounted on the first container support 211, but the example embodiments are not limited thereto.

The cap separation module 200 (e.g., the cap separator, etc.) may receive the at least one container 600 from the container supply module 100 and separate the nozzle cap 620 from the container body 610, etc. For example, in order to separate the nozzle cap 620 from the container body 610, the cap separation module 200 may grip and fix the nozzle cap 620 provided on the front-end portion 610E1 of the container body 610 using a vise and/or clamping mechanism, etc., and then rotate the container body 610 in a first rotation direction in which the screw joint between the nozzle cap 620 and the container body 610 is released, but is not limited thereto.

The fluid supply module 300 (e.g., the fluid supplier, etc.) may be arranged to be adjacent to the cap separation module 200 in a lateral and/or horizontal direction, etc., but is not limited thereto. The fluid supply module 300 may receive the container body 610, which has the nozzle cap 620 removed. The container body 610 may be loaded onto the fluid supply module 300 in a state in which the nozzle portion 611 on the front end portion 610E1 of the container body 610 is exposed and/or open. The container body 610 transported from the cap separation module 200 may be mounted on a second container support 311, etc., but is not limited thereto. The fluid supply module 300 may supply the process fluid and/or process gas discharged from the nozzle portion 611 of the container body 610 to the process chamber 510 through the fluid supply line 710 extending between the fluid supply module 300 and the process chamber 510, etc. The fluid supply line 710 may include at least one pipe and/or at least one hose through which a process fluid and/or process gas may flow, etc., but is not limited thereto.

According to some example embodiments, the fluid supply apparatus 10 may include at least one transportation robot 730 configured to transport the container body 610 between the cap separation module 200 and the fluid supply module 300, but the example embodiments are not limited thereto. The transportation robot 730 may include a gripping device configured to grip and/or support the container body 610, and/or a driving device configured to drive on the supporting surface of a stage 720, etc. The transportation robot 730 may be configured to transport the container body 610 between the first container support 211 of the cap separation module 200 and the second container support 311 of the fluid supply module 300. For example, the transportation robot 730 may be configured to perform a series of operations including: unloading the container body 610 from the first container support 211 and holding the container body 610; moving to the second container support 311 of the fluid supply module 300 while holding the container body 610; and/or mounting the container body 610 on the second container support 311 of the fluid supply module 300, etc., but is not limited thereto.

A fluid supply process using the fluid supply apparatus 10 may be controlled by at least one controller (e.g., controller 540 of FIG. 11), etc., but the example embodiments are not limited thereto. For example, the controller 540 may be processing circuitry configured to transmit and/or receive at least one electrical signal to and/or from the container supply module 100, the cap separation module 200, the fluid supply module 300, and/or the transportation robot 730, etc., and may control the operations of the container supply module 100, the cap separation module 200, the fluid supply module 300, and/or the transportation robot 730, etc. The controller 540 may be realized as special-purpose hardware such as processors, processor cores, logic circuits, storage devices, etc.; a hardware/software combination such as at least one processor core executing software and/or executing any instruction set, etc.; or a combination thereof. For example, the controller 540 may include at least one computing device, such as a workstation computer, a desktop computer, a laptop computer, a tablet computer, etc. For example, the controller 540 may include at least one memory device, such as read-only memory (ROM), random-access memory (RAM), etc., and at least one processor configured to perform at least one desired and/or predetermined operation and/or at least one desired and/or predetermined algorithm, such as a micro-processor, a central processing unit (CPU), a graphics processing unit (GPU), a programmable logic unit, a system on chip (SoC), a field programmable gate array (FPGA), an application-specific integrated circuit (ASIC), etc. Also, the controller 540 may include a receiver and/or a transmitter configured to receive and/or transmit the electrical signal, etc., but is not limited thereto.

Figure 3:
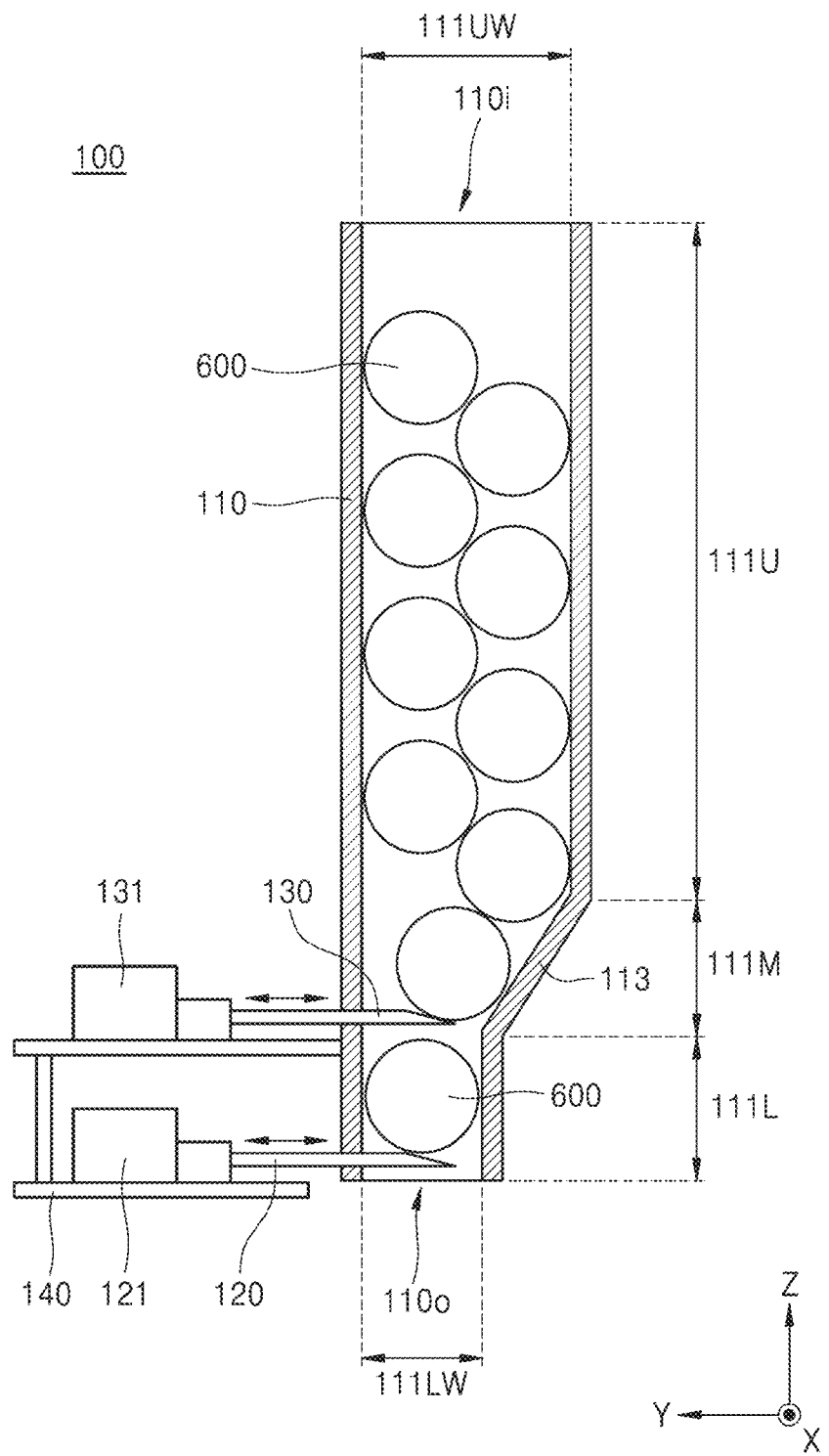
FIG. 3 is a cross-sectional view of a container supply module of FIG. 1 according to at least one example embodiment.
Figure 4:
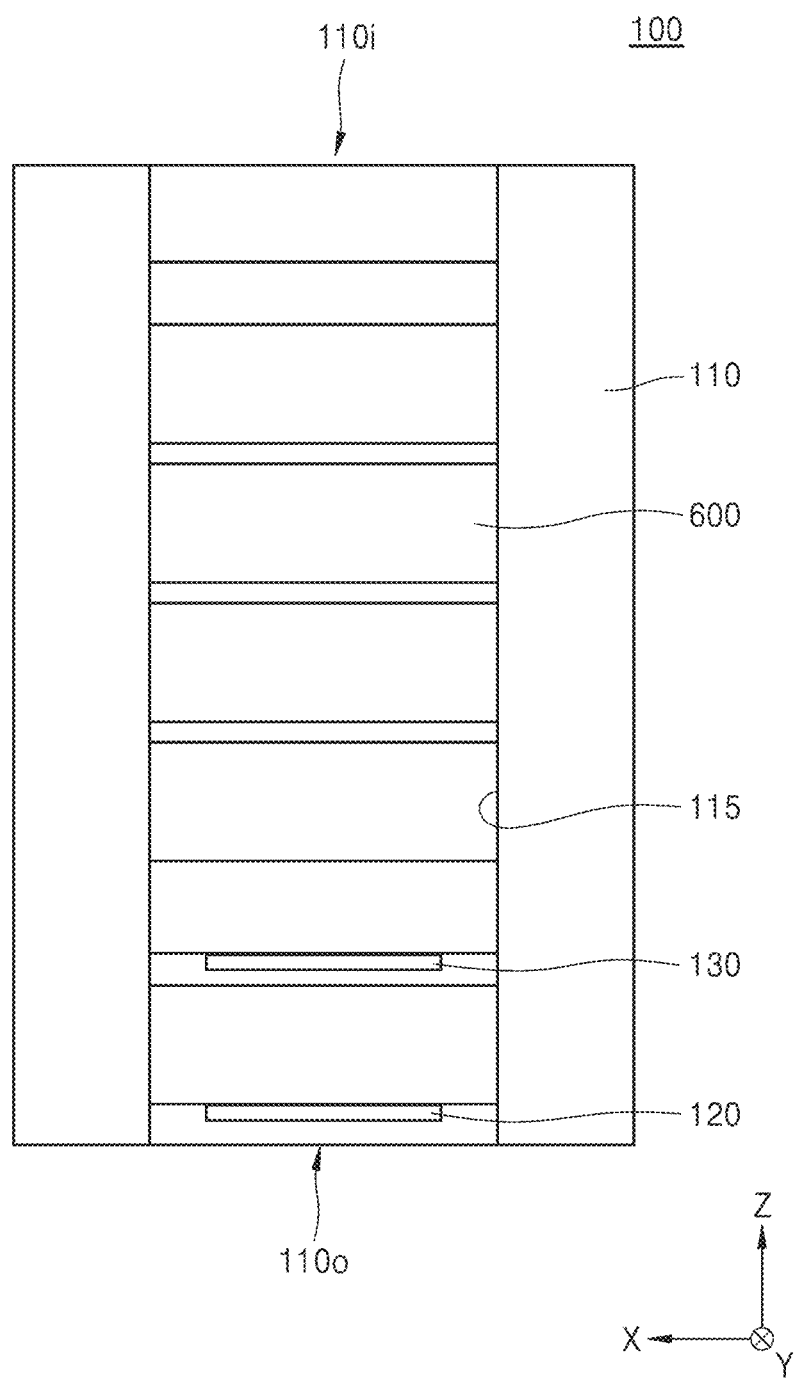
FIG. 4 is a side view of the container supply module illustrated in FIG. 3 according to at least one example embodiment.

FIGS. 3 and 4 are views of the container supply module 100 of FIG. 1 according to at least one example embodiment. FIG. 3 is a cross-sectional view of the container supply module 100, and FIG. 4 is a side view of the container supply module 100 illustrated in FIG. 3.

Referring to FIGS. 1 through 4, the container supply module 100 may include the loading box 110, a lower stopper 120, and/or an upper stopper 130, etc., but is not limited thereto, and for example, may include a greater or lesser number of constituent components.

The loading box 110 may include and/or may define a loading space in which the plurality of containers 600 are loaded. An inlet 110i through which the containers 600 are carried into and/or loaded onto the loading space may be provided on an upper portion of the loading box 110, and the outlet 110o through which the containers 600 are carried out and/or unloaded may be provided on a lower portion of the loading box 110, etc., but the example embodiments are not limited thereto.

The loading box 110 may include an upper loading space 111U, a lower loading space 111L, and/or a middle loading space 111M, etc., but is not limited thereto.

The upper loading space 111U may downwardly extend from the inlet 110i, but is not limited thereto. In the upper loading space 111U, the plurality of containers 600 may be stacked to be staggered in desired pattern, e.g., a zigzag form, etc., but is not limited thereto. In one embodiment, a first horizontal width 111UW of the upper loading space 111U in a second horizontal direction (for example, a Y direction) may be in a range between 1.1 times and 1.9 times a horizontal width of the container 600 in the second horizontal direction (for example, the Y direction), but the example embodiments are not limited thereto.

The lower loading space 111L may upwardly extend from the outlet 110o, etc. One container 600 may be accommodated in and/or stored in the lower loading space 111L. A second horizontal width 111LW of the lower loading space 111L in the second horizontal direction (for example, the Y direction) may be less than the first horizontal width 111UW of the upper loading space 111U in the second horizontal direction (for example, the Y direction), but is not limited thereto. For example, the second horizontal width 111LW of the lower loading space 111L in the second horizontal direction (for example, the Y direction) may be in a range between 1.1 times and 1.5 times the horizontal width of the container 600 in the second horizontal direction (for example, the Y direction), but the example embodiments are not limited thereto.

The middle loading space 111M may extend between the upper loading space 111U and the lower loading space 111L. The middle loading space 111M may have a tapered shape, but is not limited thereto. That is, a horizontal width of the middle loading space 111M in the second horizontal direction (for example, the Y direction) may decrease toward the outlet 110o. A side wall 113 of the loading box 110, the side wall 113 defining the middle loading space 111M, may obliquely extend (and/or be angled, etc.), so as to guide the movement of the container(s) 600 toward the lower loading space 111L. For example, the side wall 113 of the loading box 110 may extend to have an inclination angle between, for example, 30 degrees and 60 degrees with respect to the vertical direction (for example, the Z direction), but the example embodiments are not limited thereto.

The lower stopper 120 may be mounted on a frame 140 coupled to the loading box 110 and may be configured to open or close the outlet 110o of the loading box 110. For example, the lower stopper 120 may move between a closed position for blocking the discharge of the container 600 (e.g., the ejection or dropping of the container 600) through the outlet 110o of the loading box 110, and an open position for allowing the discharge of the container 600 through the outlet 110o of the loading box 110. The movement between the closed position and the open position of the lower stopper 120 may be controlled by an actuator 121, etc., but is not limited thereto.

In the closed position of the lower stopper 120, the lower stopper 120 may cover at least a portion of the outlet 110o of the loading box 110 so that the discharge of the container 600 through the outlet 110o of the loading box 110 may be decreased, restricted and/or prevented. When the lower stopper 120 is in the closed position, the container 600 accommodated and/or stored in the lower loading space 111L may be supported (and/or held) by the lower stopper 120, as illustrated in the at least one example embodiment associated with FIGS. 3 and 4, etc., but the example embodiments are not limited thereto. When the lower stopper 120 is located at the open position, the lower stopper 120 may be located such that it does not interfere with the container 600 in the lower loading space 111L, etc. For example, the open position of the lower stopper 120 may be a location where the lower stopper 120 is entirely outside the loading space of the loading box 110 and/or is withdrawn from the loading box 110 by the actuator 121, etc.

The upper stopper 130 may be mounted on the frame 140 coupled to the loading box 110 and may be configured to open or close a passage between the lower loading space 111L and the middle loading space 111M, etc. For example, the upper stopper 130 may move between a closed position for blocking the movement of the container 600 from the middle loading space 111M to the lower loading space 111L, and an open position for allowing the movement of the container 600 from the middle loading space 111M to the lower loading space 111L. The movement of the upper stopper 130 between the closed position and the open position thereof may be controlled by an actuator 131, etc., but the example embodiments are not limited thereto.

In the closed position of the upper stopper 130, the upper stopper 130 may block at least a portion of the passage between the lower loading space 111L and the middle loading space 111M to decrease, restrict and/or prevent the container 600 from being dropped into the lower loading space 111L. When the upper stopper 130 is in the closed position, the container 600 accommodated and/or stored in the middle loading space 111M may be supported by the upper stopper 130, as illustrated in the at least one example embodiment of FIGS. 3 and 4, etc., but the example embodiments are not limited thereto. When the upper stopper 130 is located at the open position, the upper stopper 130 may be located such that it does not interfere with the container 600 in the middle loading space 111M, etc. For example, the open position of the upper stopper 130 may be a location where the upper stopper 130 is entirely outside the loading space of the loading box 110 and/or is withdrawn from the loading space of the loading box 110 by the actuator 131, etc.

Figure 5A:
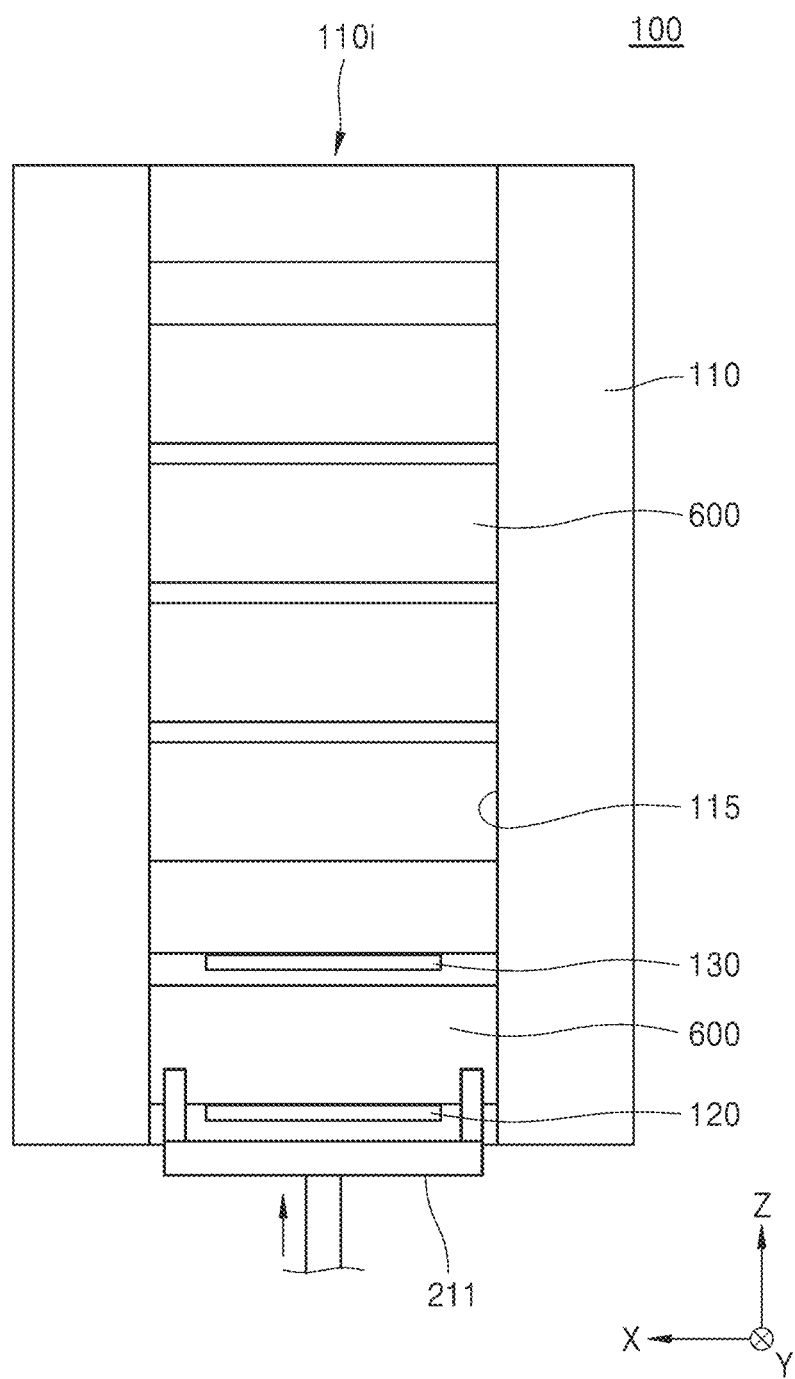
FIGS. 5A and 5B are side views for describing a container supply method using a container supply module according to at least one example embodiment.
Figure 5B:
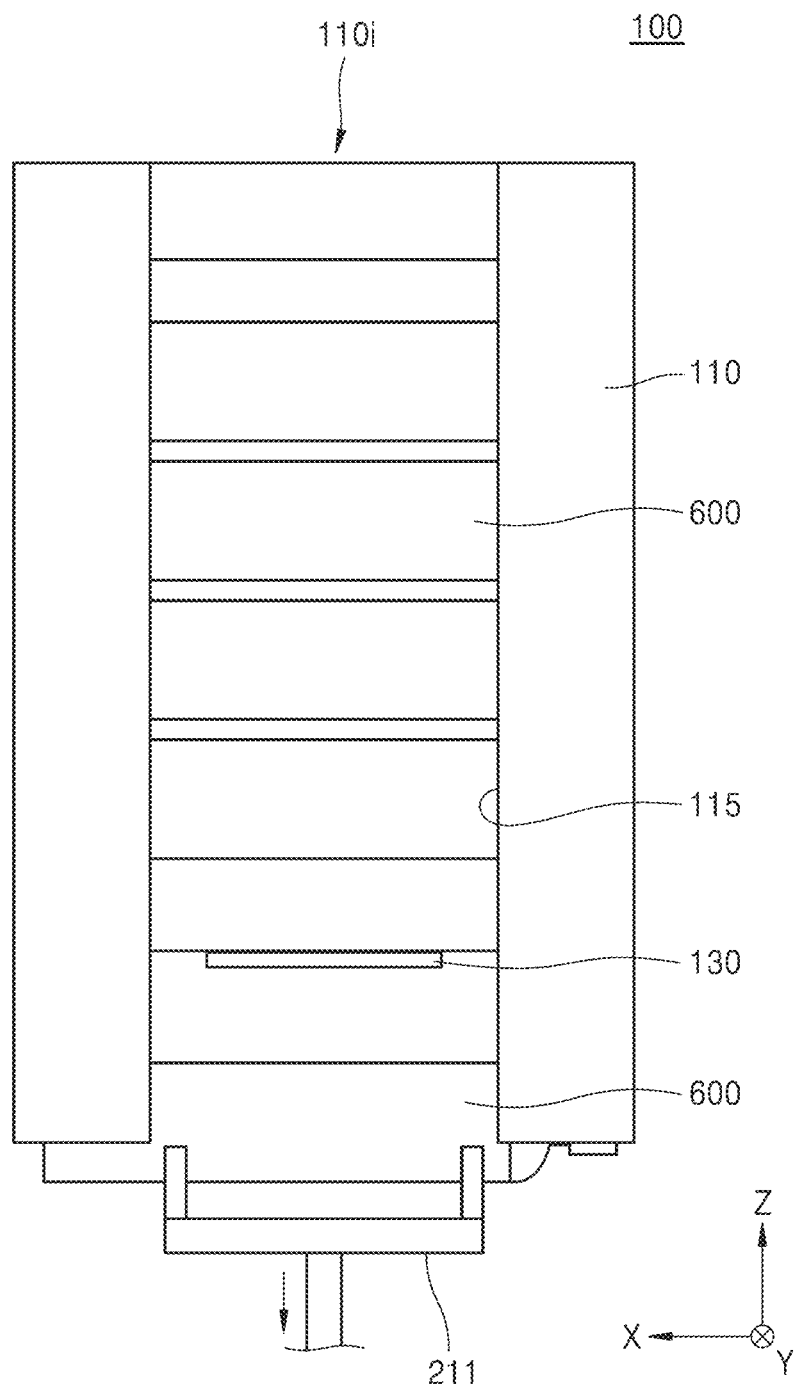

FIGS. 5A and 5B are side views for describing a container supply method using the container supply module 100 according to at least one example embodiment. Hereinafter, the container supply method using the container supply module 100 is described with reference to FIGS. 5A and 5B together with FIGS. 1 through 4.

Referring to FIG. 5A, while the lower stopper 120 closes the outlet 110o of the loading box 110 and the upper stopper 130 closes the passage between the middle loading space 111M and the lower loading space 111L, the loading box 110 may be moved to a location at which the outlet 110o of the loading box 110 may be aligned with the first container support 211 in the vertical direction (for example, the Z direction). When the first container support 211 is aligned with the outlet 110o of the loading box 110, the first container support 211 may enter the lower loading space 111L of the loading box 110 and may support the container 600 contained and/or stored in the lower loading space 111L. As illustrated in FIG. 5A, the first container support 211 may enter the lower loading space 111L through an opening 115 formed on a side wall of the loading box 110, without interfering with the loading box 110, but the example embodiments are not limited thereto.

Referring to FIG. 5B, when the container 600 is supported by the first container support 211, the lower stopper 120 may move to the open position to allow the discharge (and/or descent) of the container 600 through the outlet 110o of the loading box 110. After the lower stopper 120 moves to the open position, the first container support 211 may descend so that the container 600 may completely be removed from the loading box 110, etc.

Next, after making the first container support 211 on which the container 600 is mounted descend, a single container 600 may be arranged in the lower loading space 111L, but the example embodiments are not limited thereto. For example, after the actuator 121 moves the lower stopper 120 to the closed position, the actuator 131 may move upper stopper 130 to the open position so that the container 600 accommodated and/or stored in the middle loading space 111M may be moved to the lower loading space 111L, etc. When the upper stopper 130 is moved to the open position, the container 600 may be moved from the middle loading space 111M to the lower loading space 111L and may be supported by the lower stopper 120. When the container 600 is arranged in and/or moved to the lower loading space 111L, the actuator 131 may move the upper stopper 130 back to the closed position so that another container 600 may not be introduced into and/or enter the lower loading space 111L, etc.

Figure 6:
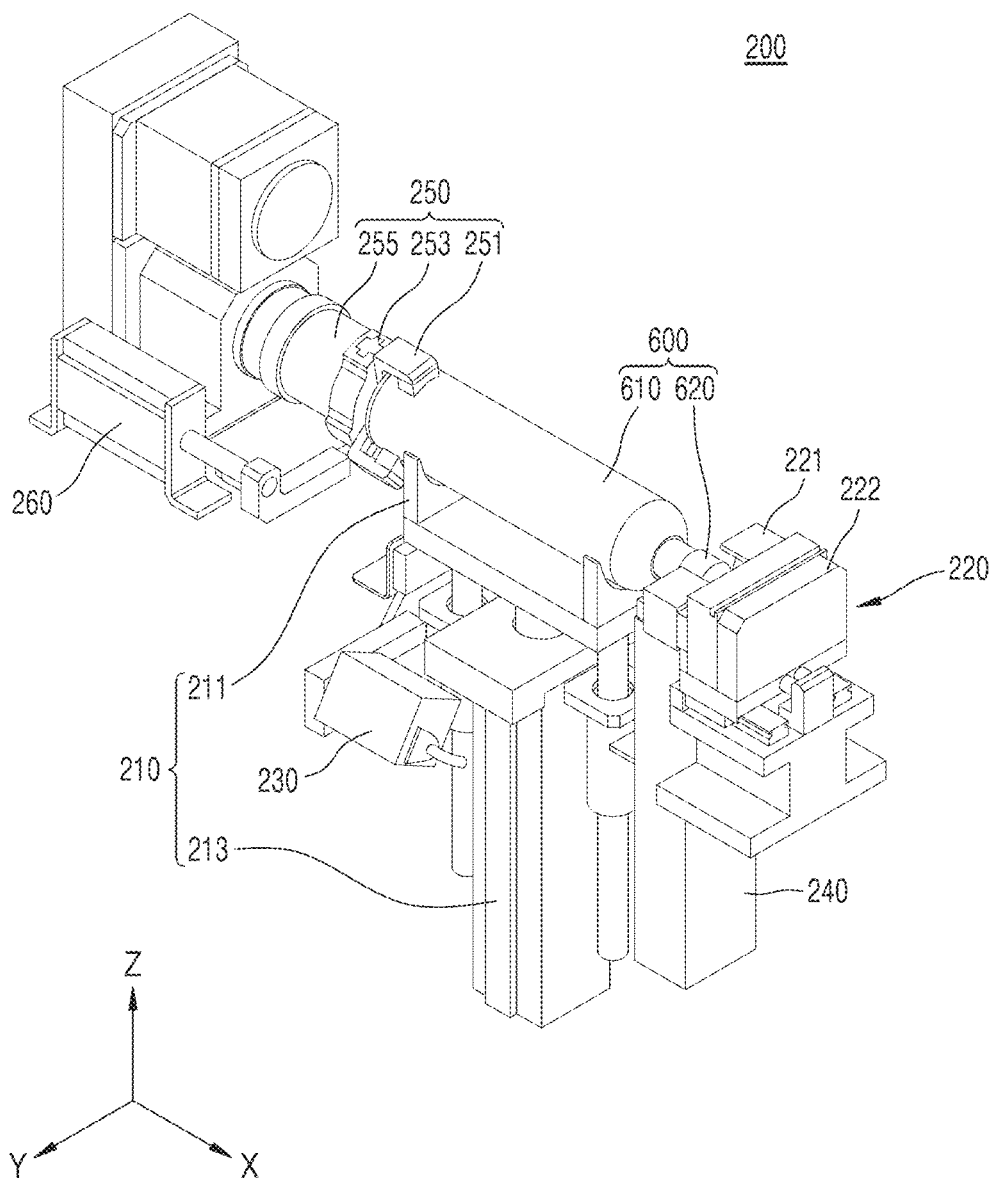
FIG. 6 is a perspective view of a cap separation module of FIG. 1 according to at least one example embodiment.

FIG. 6 is a perspective view of the cap separation module 200 of FIG. 1 according to at least one example embodiment.

Referring to FIGS. 1, 2, and 6, the cap separation module 200 (e.g., the cap separator, etc.) may include a first container support module 210 (e.g., a first container supporter, etc.), a cap clamp module 220 (e.g., a cap clamp, etc.), a container rotation module 250 (e.g., a container rotator, etc.), a tag reader 230, and/or a cap collecting box 240, etc., but the example embodiments are not limited thereto.

The first container support module 210 (e.g., the first container supporter, etc.) may include the first container support 211 configured to support the container 600 provided by the container support module 100. On the first container support 211, the container 600 may be located between the cap clamp module 220 (e.g., the cap clamp) and the container rotation module 250 (e.g., the container rotator) spaced apart from each other in a first horizontal direction (for example, an X direction), but the example embodiments are not limited thereto. The container 600 may be mounted on the first container support 211 such that a length direction of the container 600 may be parallel with the first horizontal direction (for example, the X direction), but is not limited thereto. When the container 600 is mounted on the first container support 211, the rear end portion 610E2 of the container body 610 may be facing toward the container rotation module 250, and the front end portion 610E1 of the container body 610 may be facing toward the cap clamp module 220, but the example embodiments are not limited thereto.

The first container support module 210 may include at least one lift actuator 213 configured to lift and/or lower the first container support 211, etc. A location of the first container support 211 in a vertical direction (for example, a Z direction) may be adjusted by the lift actuator 213, etc. For example, the first container support 211 may be at a first vertical height during the performance of a cap separation operation, in which the nozzle cap 620 is separated from the container body 610, and may be at a second vertical height that is, for example, higher than the first vertical height, while the first container support 211 is transported to the loading space of the loading box 110 and mounted to the container 600, etc., but the example embodiments are not limited thereto.

The cap clamp module 220 (e.g., the cap clamper, etc.) may be arranged at the side of the front end portion 610E1 of the container body 610 mounted on the first container support 211, but is not limited thereto. The cap clamp module 220 may include a clamping body 221 configured to grip and fix the nozzle cap 620 coupled on the front end portion 610E1 of the container body 610, etc. The cap clamp module 220 may include at least two clamping bodies 221 spaced apart from each other and configured to allow the nozzle cap 620 to be located therebetween. Each of the two clamping bodies 221 may be configured to be moved by a clamping actuator, etc., but is not limited thereto. The two clamping bodies 221 may be moved by the clamping actuator between a clamping position to grip and fix the nozzle cap 620 and a standby position at which the two clamping bodies 221 are spaced apart from the nozzle camp 620, etc. For example, in the clamping position, the two clamping bodies 221 may adhere to both side portions of the nozzle cap 620, etc. When the two clamping bodies 221 are in the clamping position, rotation of the nozzle cap 620 may be limited and/or may be fixed while the container body 610 is rotated by the container rotation module 250, but the example embodiments are not limited thereto, and for example the clamping bodies 221 may rotate the nozzle cap 620, etc., while the container body 610 is held in a fixed position, etc., and/or both the clamping bodies 221 and the container body 610 may be rotated in opposite rotational directions, etc.

The container rotation module 250 (e.g., the container rotator) may be arranged at the side of the rear end portion 610E2 of the container body 610 mounted on the first container support 211, but the example embodiments are not limited thereto. The container rotation module 250 may include gripping bodies 251, a base body 253, and/or a rotation actuator 255, etc., but is not limited thereto.

The gripping bodies 251 may be configured to grip and fix (and/or hold) the rear end portion 610E2 of the container body 610, etc. The gripping bodies 251 may be mounted on the base body 253 facing the rear end portion 610E2 of the container body 610 and may be spaced apart from each other in a circumferential direction of the base body 253, but are not limited thereto. The gripping bodies 251 may be configured to be moved using a gripping actuator, etc., but is not limited thereto. For example, the gripping bodies 251 may be moved by the gripping actuator between a gripping position in which the gripping bodies 251 adhere to the container body 610 to grip and fix (and/or hold) the rear end portion 610E2 of the container body 610, and a standby position in which the gripping bodies 251 are spaced apart from the container body 610 to release the gripping of the container body 610 (e.g., release the container body 610), etc. While the gripping bodies 251 are gripping (e.g., holding) the rear end portion 610E2 of the container body 610, the rotation actuator 255 may rotate the base body 253 to which the gripping bodies 251 are coupled with respect to a rotation axis (e.g., RX of FIG. 7*b*), etc. The rotation axis (RX) may be parallel to a length direction of the container 600 mounted on the first container support 211. During the rotation of the base body 253, the container body 610 gripped by the gripping bodies 251 may also be rotated with respect to the rotation axis RX, but the example embodiments are not limited thereto.

The container rotation module 250 may rotate the container 600, while the clamping bodies 221 of the cap clamp module 220 clamp the nozzle cap 620, etc. For example, while the container 600 is rotated in a first rotation direction by the container rotation module 250, the nozzle cap 620 may be clamped by the clamping bodies 221 and may not be rotated, and the nozzle cap 620 coupled to the container body 610 by a screw joint may be separated from the container body 610, etc., but the example embodiments are not limited thereto.

The container rotation module 250 may be configured to be moved by being connected to an actuator 260, etc., but is not limited thereto. For example, the actuator 260 may move the container rotation module 250 in the first horizontal direction (for example, the X direction) such that a distance between the base body 253 and the container body 610 mounted on the first container support 211 is adjusted, but the example embodiments are not limited thereto. For example, the container rotation module 250 may be configured to be moved by the actuator 260 between a forward position and a backward position, etc. While the container rotation module 250 is moved from the forward position to the backward position, the container rotation module 250 may be move in a direction from the front end portion 610E1 of the container body 610 toward the rear end portion 610E2 of the container body 610, etc. While the container 600 is loaded on the first container support 211 and/or unloaded from the first container support 211, the container rotation module 250 may be located in the backward position to reduce, restrict, and/or prevent interference between the container rotation module 251 and the container 600. Also, while the gripping bodies 251 of the container rotation module 250 grip and/or hold the container 600, the container rotation module 250 may be located in the forward position, etc.

The cap collecting box 240 may be provided below the cap separation module 200. The cap collecting box 240 may include a space for accommodating and/or storing the nozzle cap 620 separated from the container body 610. When the nozzle cap 620 is separated from the container body 610, the clamping bodies 221 may return to the standby position from the clamping position, and the nozzle cap 620 may freely drop and/or descend from the clamping bodies 221 and may be received by the cap collecting box 240 provided below the clamping bodies 221, etc.

The tag reader 230 may be configured to recognize an identification tag provided on an outer surface of the container body 610. For example, the tag reader 230 may include a radio-frequency identification (RFID) reader, etc., but the example embodiments are not limited thereto, and may further include a barcode reader, a quick response (QR) code reader, a Bluetooth tag reader, etc. According to some example embodiments, the tag reader 230 may be configured to recognize the identification tag provided on the outer surface of the container body 610 while the container 600 is rotated on the first container support shaft 221 by the container rotation module 250, etc.

Figure 7A:
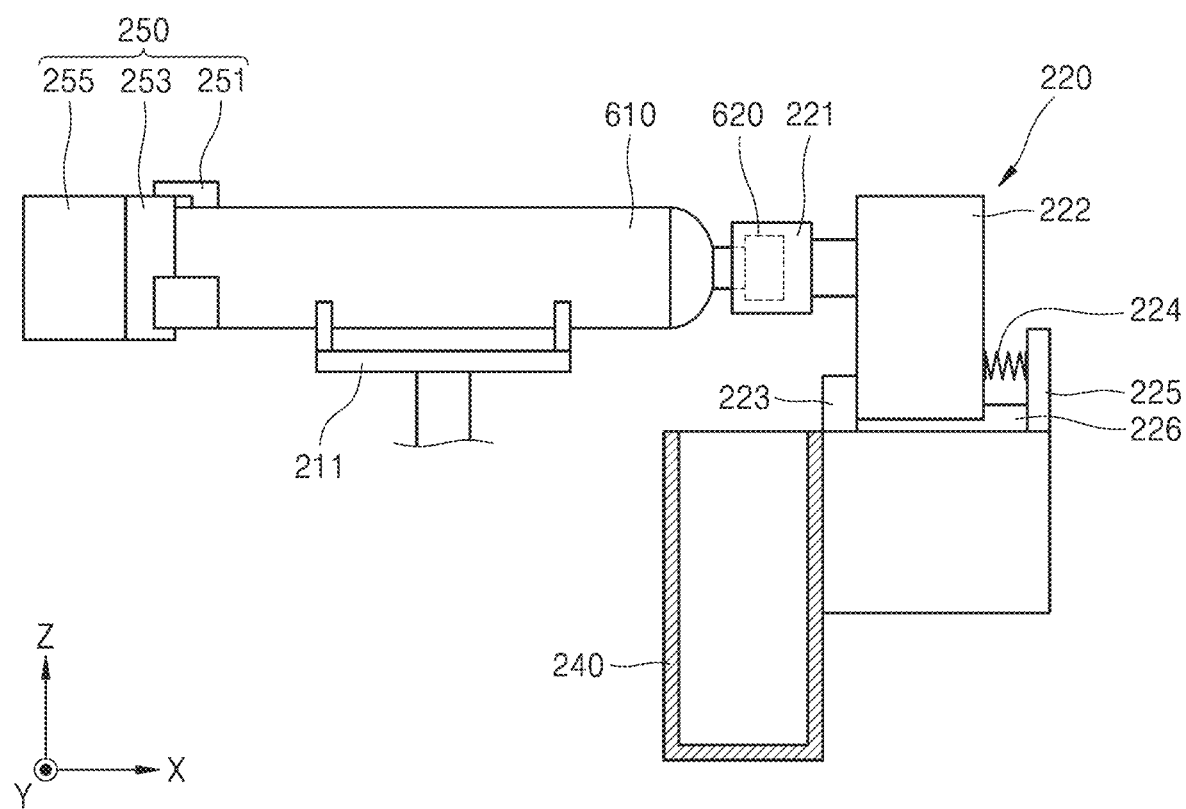
FIGS. 7A through 7C are conceptual views for describing a cap separation method using a cap separation module according to at least one example embodiment.
Figure 7B:
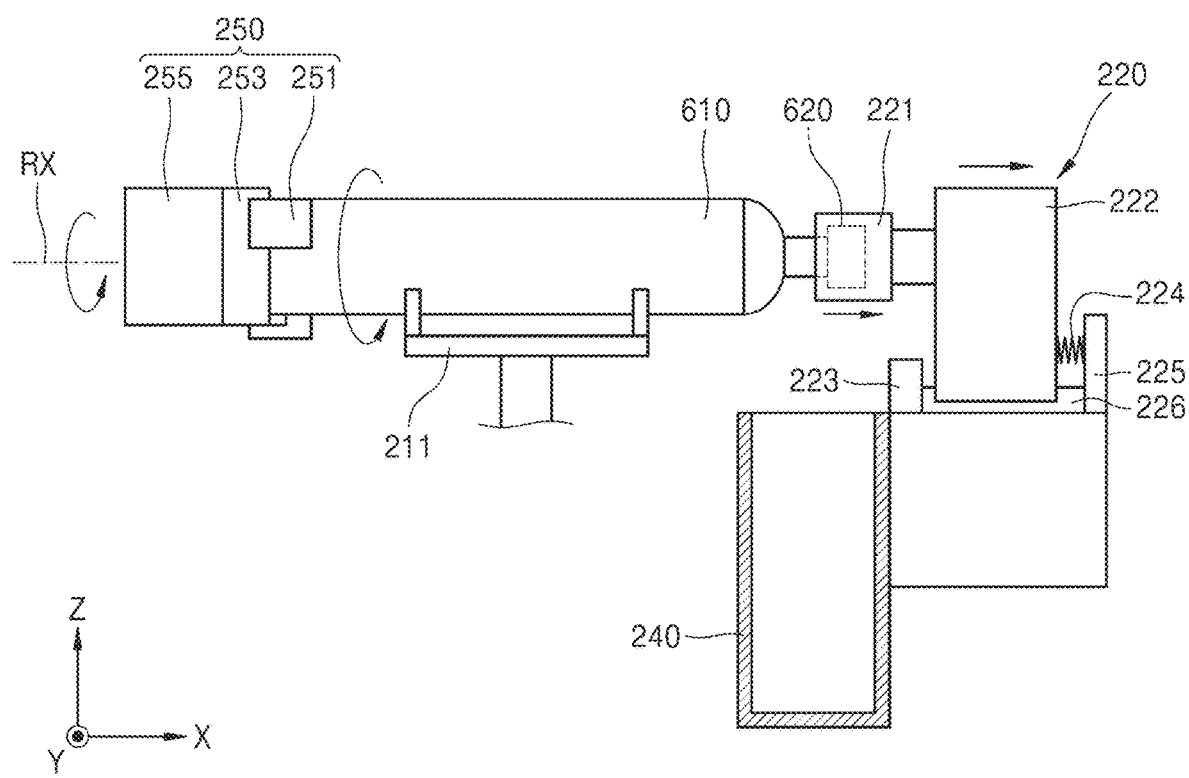
Figure 7C:
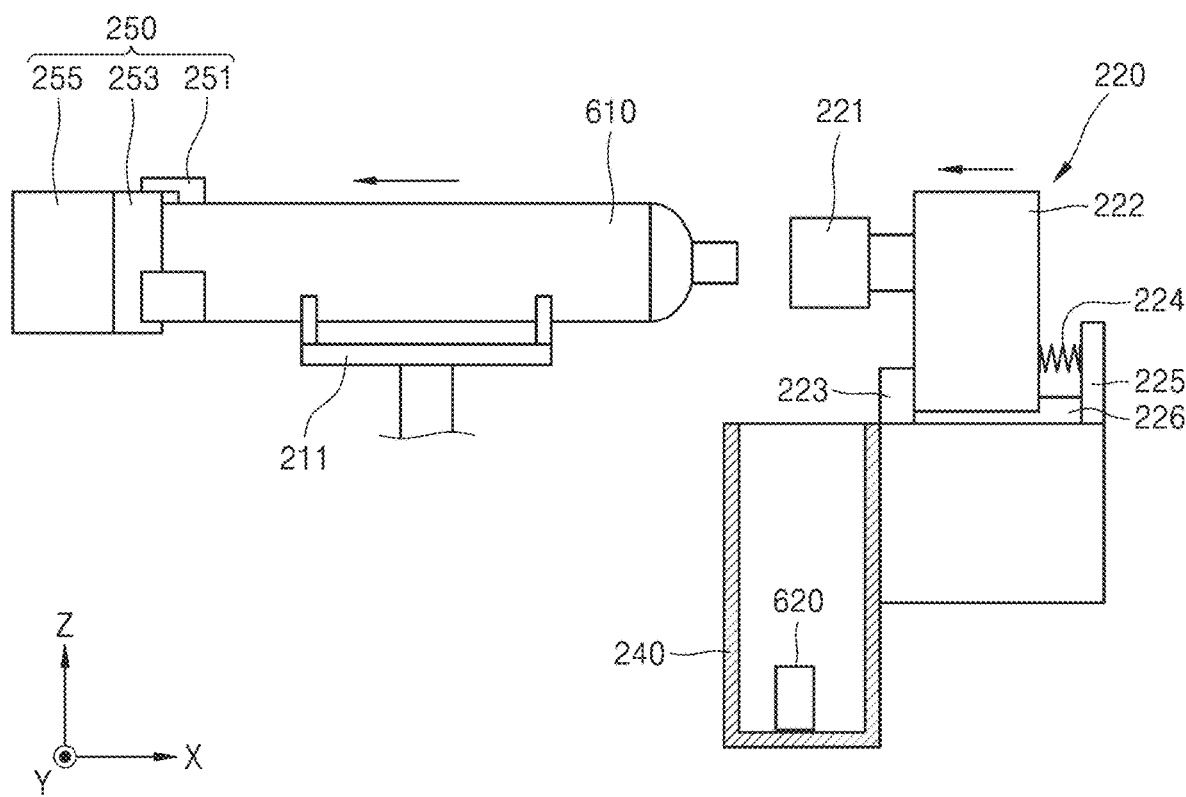

FIGS. 7A through 7C are conceptual views for describing a cap separation method using the cap separation module 200 according to at least one example embodiment. Hereinafter, the cap separation method by which the nozzle cap 620 is separated from the container body 610 is described with reference to FIGS. 7A through 7C together with FIGS. 1, 2, and 6.

Referring to FIG. 7A, according to at least one example embodiment, when the container 600 is mounted on the first container support 211, the rear end portion 610E2 of the container body 610 may be gripped and fixed (and/or held) by the gripping bodies 251, etc. Also, the clamping bodies 221 may be moved from a standby position to a clamping position so that the nozzle cap 620 may be clamped and fixed (and/or held) by the clamping bodies 221, etc.

Referring to FIG. 7B, the container rotation module 250 may rotate the container body 610 fixed to the gripping bodies 251 so that a screw joint between the nozzle cap 620 and the container body 610 is released. The container body 610 may be rotated on the first container support 211 with a length direction of the container 600 as a rotation axis RX, etc. For example, the rotation axis RX may be a direction parallel to a first horizontal direction (for example, an X direction), but the example embodiments are not limited thereto. While the container body 610 is rotated, rotation of the nozzle cap 620 fixed to the clamping bodies 221 may be limited. While the container body 610 is rotated, the screw joint between the container body 610 and the nozzle cap 620 may be released, etc.

According to some example embodiments, the cap clamp module 220 may include a moving block 222 to which the clamping bodies 221 are coupled, a linear movement guide 226 configured to guide the movement of the moving block 222, a stopper 223, and/or an elastic member 224, etc., but the example embodiments are not limited thereto. The linear movement guide 226 may extend in the length direction of the container 600 mounted on the first container support 211 and may be, for example, a rail guiding a linear movement of the moving block 222, but is not limited thereto. The moving block 222 may linearly move between a first end and the second end of the linear movement guide 226 along the linear movement guide 226. The first end of the linear movement guide 226 may be more adjacent to (and/or closer to) the first container support 211 than the second end, and the second end of the linear movement guide 226 may be farther from the first container support 211 than the first end, but the example embodiments are not limited thereto.

The stopper 223 may be provided at the first end of the linear movement guide 226. The stopper 223 may limit a movement range of the moving block 222. The stopper 223 may include a highly elastic material, such as urethane, etc., but the example embodiments are not limited thereto.

The elastic member 224 may be arranged at the second end of the linear movement guide 226. For example, the elastic member 224 may be mounted on a frame 225 arranged at the second end of the linear movement guide 226. The elastic member 224 may provide a restoring force to the moving block 222 in a direction from the second end to the first end of the linear movement guide 226. The elastic member 224 may include, for example, a compression spring, etc., but is not limited thereto.

As illustrated in FIG. 7B, when the container body 610 is rotated in a state in which the rotation of the nozzle cap 620 is limited and/or fixed, the nozzle cap 620 may be horizontally moved in a direction such that a screw joint between the nozzle cap 620 and the container body 610 is released, via the relative rotation of the container body 610 against the nozzle cap 620, etc. For example, when the nozzle cap 620 is coupled to the container body 610 by a screw joint via rotation in the first horizontal direction (for example, the X direction) as a rotation axis RX, the nozzle cap 620 may be linearly moved in the first horizontal direction (for example, the X direction), while the screw joint between the nozzle cap 620 and the container body 610 is released via the relative rotation of the container body 610 against the nozzle cap 620, etc. During the linear movement of the nozzle cap 620, the moving block 222 coupled to the clamping body 221 may move from the first end to the second end of the linear movement guide 226, etc.

Referring to FIG. 7C, after releasing the screw joint between the container body 610 and the nozzle cap 620, the container rotation module 250 may backwardly move (e.g., move in reverse, etc.) the container body 610 away from the clamping bodies 221 while the gripping bodies 251 grip and/or hold the container body 610. With the backward (e.g., reverse) movement of the container body 610, the nozzle cap 620 gripped by the clamping bodies 221 and the container body 610 may be separated from each other, and the moving block 222 may move from the second end to the first end of the linear movement guide 226 via the restoring force of the elastic member 224 (e.g., the stored potential energy of the elastic member 224, etc.). Next, the clamping bodies 221 may move to the standby position from the clamping position to release the gripping of the nozzle cap 620, and the nozzle cap 620 may drop into the cap collecting box 240 below the clamping bodies 221, etc.

Figure 8:
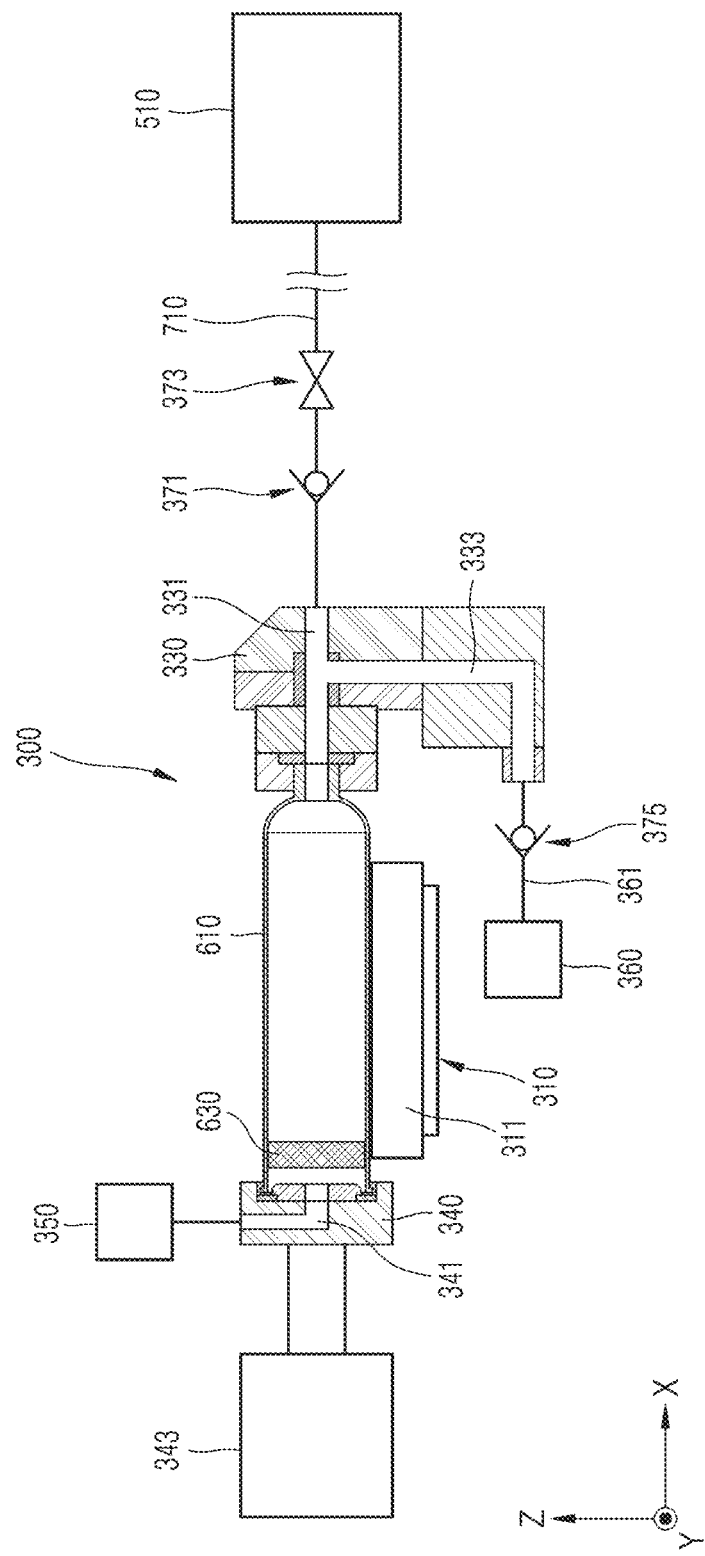
FIG. 8 is a schematic diagram of a fluid supply module of FIG. 1 according to at least one example embodiment.
Figure 9:
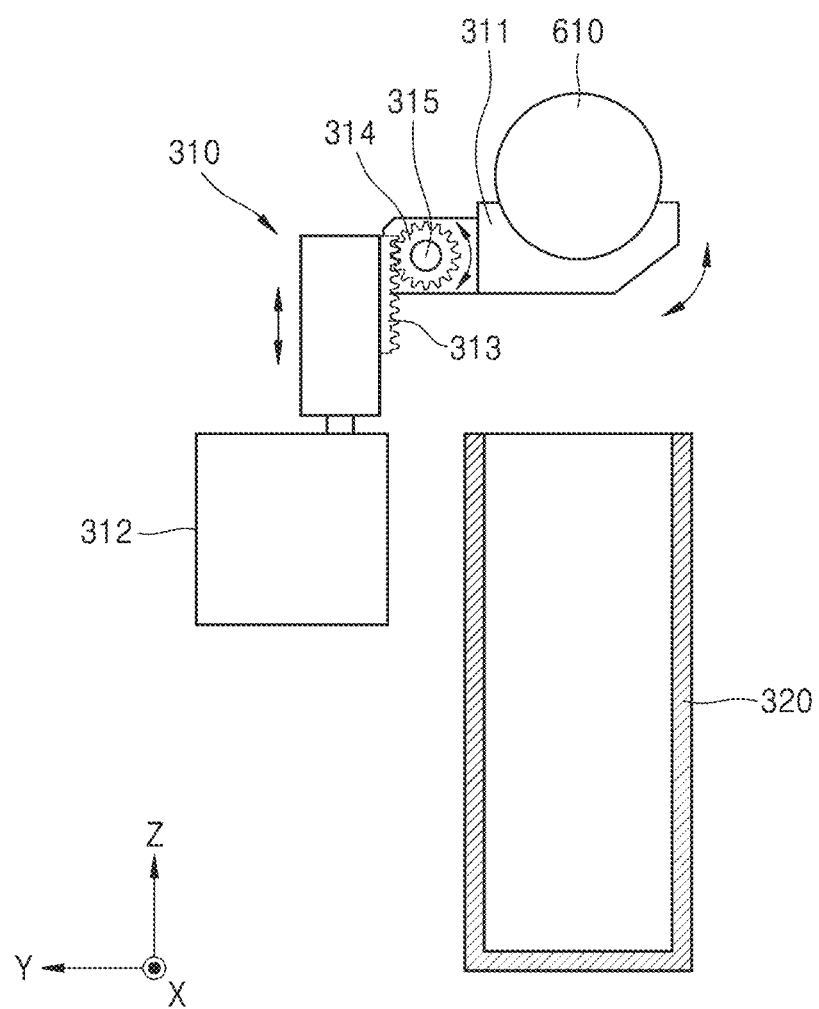
FIG. 9 is a schematic diagram of a second container support module of FIG. 8 according to at least one example embodiment.

FIG. 8 is a schematic diagram of the fluid supply module 300 of FIG. 1 according to at least one example embodiment. FIG. 9 is a schematic diagram of a second container support module 310 of FIG. 8.

Referring to FIGS. 1, 2, 8, and 9, the fluid supply module 300 may include the second container support module 310 (e.g., the second container supporter, etc.), a container collecting box 320, an adapter 330, a rear end frame 340, a plunger actuator 350, and/or a residue retrieving air pump 360, etc., but the example embodiments are not limited thereto.

The second container support module 310 (e.g., the second container supporter) may include at least one second container support 311 on which the container body 610 provided from the cap separation module 200 is mounted. The container body 610 may be mounted on the second container support 311 in a state in which the nozzle cap 620 is separated from the container body 610, etc. When the container body 610 is mounted on the second container support 311, the container body 610 may be between the adapter 330 and the rear end frame 340 spaced apart from each other in a first horizontal direction (for example, an X direction), but is not limited thereto. The container body 610 may be mounted on the second container support 311 such that a length direction thereof is parallel to the first horizontal direction (for example, the X direction), but is not limited thereto. When the container body 610 is mounted on the second container support 311, the rear end portion 610E2 of the container body 610 may be toward the rear end frame 340, and the front end portion 610E1 of the container body 610 may be toward the adapter 330, but the example embodiments are not limited thereto.

The second container support 311 may be configured to pivot (and/or rotate, move, etc.) between a supporting position for supporting the container body 610 and a container separation position for dropping the container body 610 down into the container collecting box 320 provided below the second container support 311. For example, the second container support 311 may be configured to pivot with respect to a pivot axis that is parallel to the first horizontal direction (for example, the X direction), but is not limited thereto. When the controller 540 determines that a process fluid in the container body 610 is exhausted, the controller 540 may cause the second container support 311 to pivot from the supporting position to the container separation position, and may drop the container body 610 into an accommodation space in the container collecting box 320, etc.

The second container support 311 may be mounted on a shaft 315 to be pivotable, and a rotation angle of the second container support 311 may be controlled by using an actuator 312, etc., but is not limited thereto. According to some example embodiments, the second container support module 310 may include the actuator 312, such as an air cylinder, a rack gear 313 configured to be linearly moved in a vertical direction (for example, a Z direction) by the actuator 312, and/or a pinion gear 314 in gear with the rack gear 313, etc., but is not limited thereto. The pinion gear 314 may be provided on an outer circumferential surface of the shaft 315 and may rotate in gear with the rack gear 313. While the pinion gear 314 rotates in gear with the rack gear 313 linearly moving, the shaft 315 may rotate, and the second container support 311 coupled to the shaft 315 may pivot, etc.

The adapter 330 may support the front end portion 610E1 of the container body 610, on which the nozzle portion 611 is provided. For example, a portion of the container body 610 may be inserted into a mounting hole of the adapter 330 and may be fixed and/or held in place, etc. The adapter 330 may include a first fluid passage 331 extending between the nozzle portion 611 of the container body 610 and an outlet of the adapter 330 to which the fluid supply line 710 is connected, etc. The first fluid passage 331 may guide the process fluid and/or process gas discharged from the nozzle portion 611 of the container body 610 to the fluid supply line 710. The fluid supply line 710 may extend between the outlet of the adapter 330 and the process chamber 510, and the process fluid and/or process gas discharged through the adapter 330 may be provided to the process chamber 510 through the fluid supply line 710, etc.

According to some example embodiments, the fluid supply module 300 (e.g., the fluid supplier) may include a first check valve 371 and an on-off valve 373 mounted on the fluid supply line 710. The first check valve 371 may reduce, restrict, and/or prevent the process fluid in the fluid supply line 710 from flowing backwards toward the outlet of the adapter 330. The on-off valve 373 may selectively open and/or close a passage of the fluid supply line 710. The opening and/or closing operation of the on-off valve 373 may be controlled by an actuator, such as a rotary cylinder, etc., but is not limited thereto. FIG. 8 illustrates that the first check valve 371 and the on-off valve 373 are provided outside the adapter 330. However, in some example embodiments, the first check valve 371 and/or the on-off valve 373 may be mounted on the first fluid passage 331 of the adapter 330, etc.

The rear end frame 340 may support the rear end portion 610E2 of the container body 610. For example, the rear end portion 610E2 of the container body 610 may be inserted into a mounting hole of the rear end frame 340 and may be fixed and/or held. The rear end frame 340 may be connected to an actuator 343, and the actuator 343 may be configured to move the rear end frame 340, etc. For example, the rear end frame 340 may be moved in the first horizontal direction (for example, the X direction) by the actuator 343. For example, the rear end frame 340 may be configured to be moved between a forward position and/or a backward position by the actuator 343. While the rear end frame 340 is moved from the forward position to the backward position, the rear end frame 340 may be move in a direction away from the adapter 330, etc. When the rear end frame 340 is in the forward position, the rear end frame 340 may support the rear end portion 610E2 of the container body 610 mounted on the second container support 311, etc. When the rear end frame 340 is in the forward position, the actuator 343 may press the rear end frame 340 so that the rear end frame 340 may adhere to the rear end portion 610E2 of the container body 610, but is not limited thereto. While the container body 610 is loaded on the second container support 311 and/or unloaded from the second container support 311, the rear end frame 340 may be located in the backward position not to interfere with the container body 610, but is not limited thereto.

The plunger actuator 350 may be configured to press and/or move the plunger 630 provided in the container body 610. According to some example embodiments, the plunger actuator 350 may include, e.g., an air pump configured to press the plunger 630 using pneumatic pressure, but the example embodiments are not limited thereto. In this case, the rear end frame 340 may include a pneumatic channel 341 extending from the rear end portion 610E2 of the container body 610, and the plunger actuator 350 may provide pneumatic pressure to the pneumatic channel 341 of the rear end frame 340, etc.

The residue retrieving air pump 360 may provide pneumatic pressure to a second fluid passage 333 in the adapter 330 through a pneumatic pressure supply line 361. The second fluid passage 333 of the adapter 330 may extend between the pneumatic pressure supply line 361 and the first fluid passage 331, etc. For example, when the controller 540 determines that the process fluid in the container body 610 is exhausted, the controller 540 may cause the residue retrieving air pump 360 to provide pneumatic pressure to the second fluid passage 333 through the pneumatic pressure supply line 361, and thus, the process fluid remaining in the second fluid passage 333 and the first fluid passage 331 may be retrieved into the container body 610, etc.

According to some example embodiments, a second check valve 375 may be mounted on the pneumatic pressure supply line 361. The second check valve 375 may reduce, restrict, and/or prevent the process fluid in the fluid passage of the adapter 330 and/or in the pneumatic pressure supply line 361 from flowing backward toward the residue retrieving air pump 360, etc. FIG. 8 illustrates that the second check valve 375 may be provided outside the adapter 330. However, in some example embodiments, the second check valve 375 may be mounted on the second fluid passage 333 of the adapter 330.

Figure 10A:
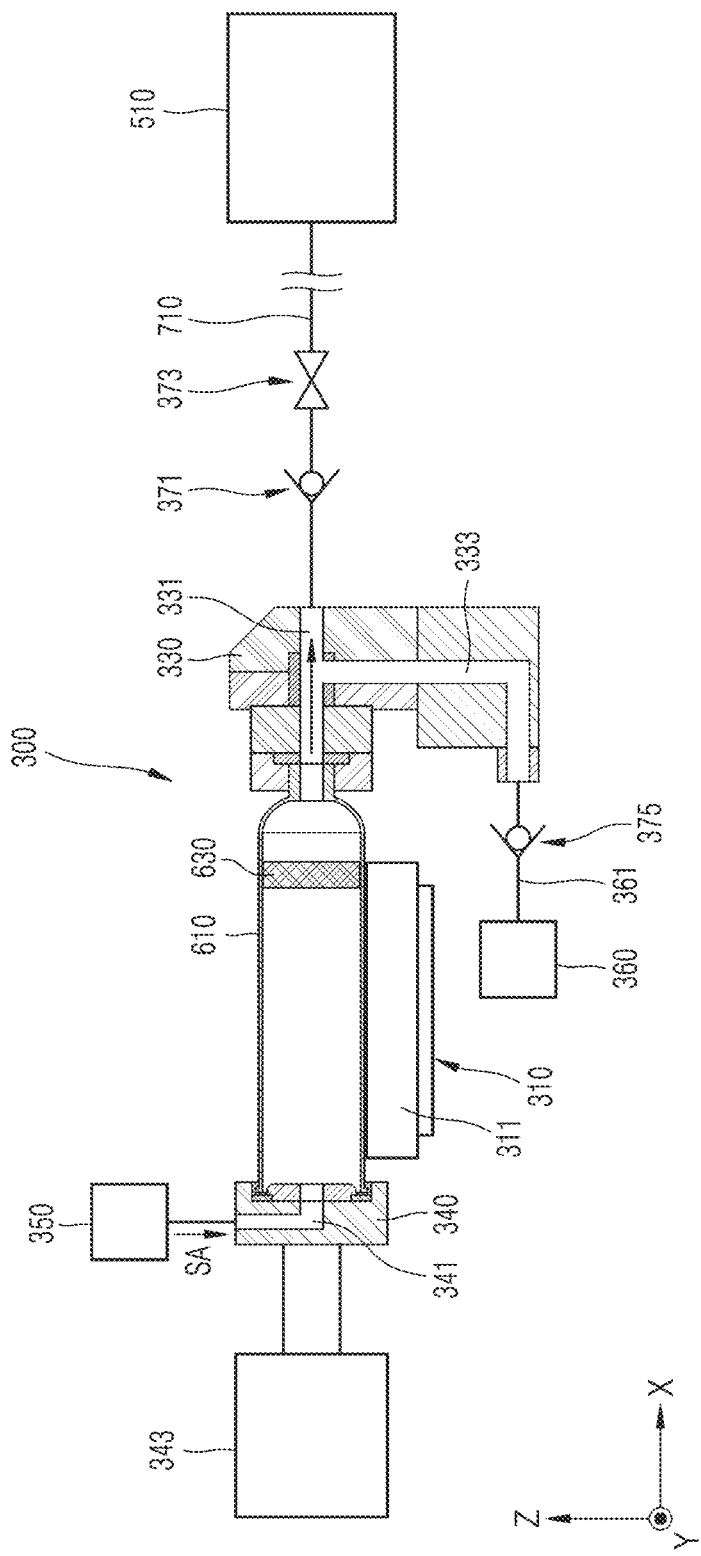
FIGS. 10A and 10B are conceptual views for describing a fluid supply method using a fluid supply module according to at least one example embodiment.
Figure 10B:
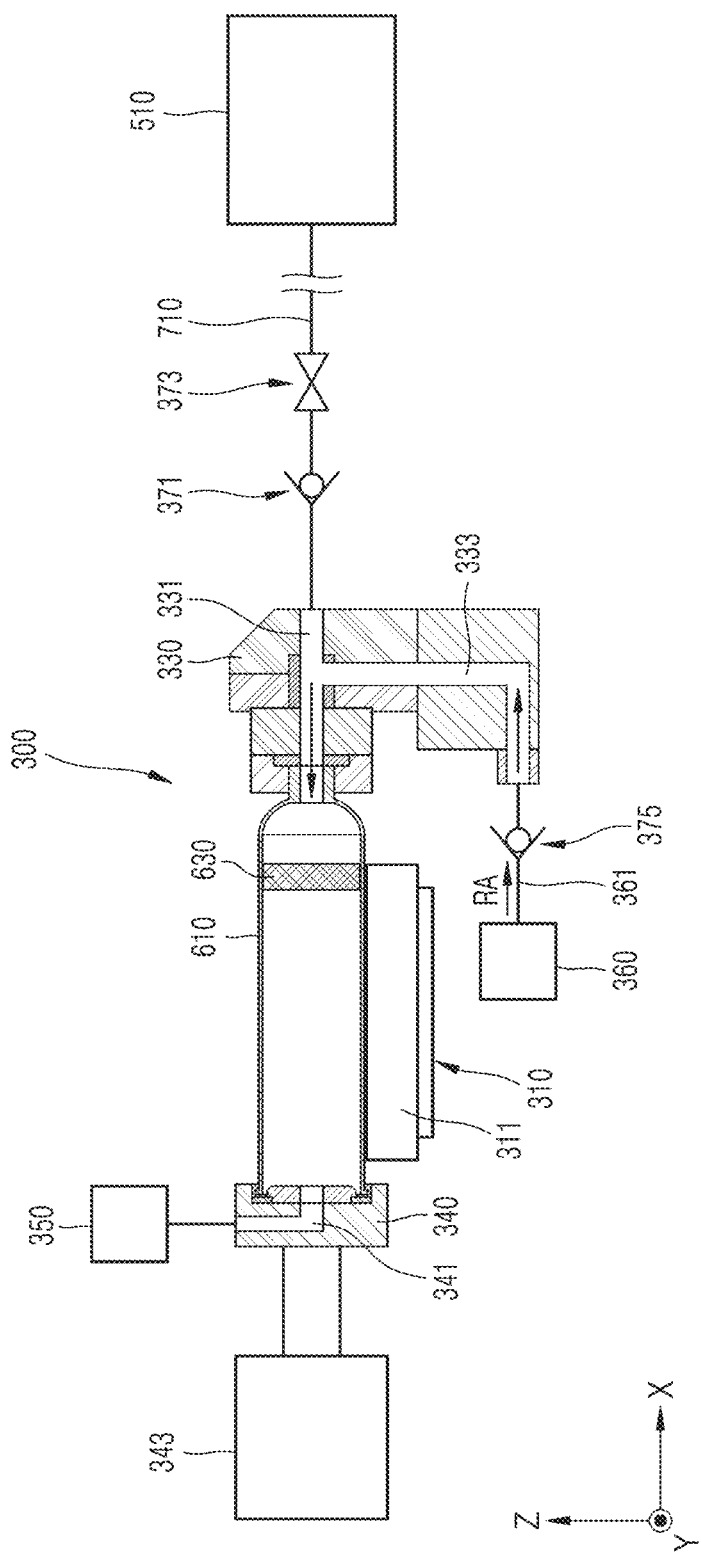

FIGS. 10A and 10B are conceptual views for describing a fluid supply method using the fluid supply module 300 according to at least one example embodiment. Hereinafter, the fluid supply method using the fluid supply module 300 is described with reference to FIGS. 10A and 10B together with FIGS. 1, 2, 8, and 9.

Referring to FIG. 10A, after mounting the container body 610 on the second container support 311, the front end portion 610E1 of the container body 610 may be supported by using the adapter 330, and the rear end portion 610E2 of the container body 610 may be supported by using the rear end frame 340, but the example embodiments are not limited thereto. When the rear end portion 610E2 of the container body 610 is docked on the rear end frame 340, the on-off valve 373 may be located in the open position so that the flowing of the process fluid toward the process chamber 510 in the fluid supply line 710 is allowed, and pneumatic pressure SA may be provided to the pneumatic channel 341 of the rear end frame 340 by using the plunger actuator 350, etc. The pneumatic pressure SA provided by the plunger actuator 350 may be applied to the plunger 630 of the container body 610 through the pneumatic channel 341 of the rear end frame 340. The plunger 630 may be pressed by the pneumatic pressure in a direction from the rear end portion 610E2 of the container body 610 toward the front end portion 610E1 of the container body 610, and the process fluid in the container body 610 may be discharged to the first fluid passage 331 of the adapter 330 through the nozzle portion 611, etc.

Referring to FIG. 10B, when the controller 540 determines that the process fluid in the container body 610 is exhausted, the controller 540 may cause the on-off valve 373 to be changed to the closed position so that a fluid passage in the fluid supply line 710 is closed, and then, the controller 540 may control the residue retrieving air pump 360 to provide pneumatic pressure RA to the second fluid passage 333. Via the pneumatic pressure RA provided by the residue retrieving air pump 360, the process fluid remaining in the first fluid passage 331 and the second fluid passage 333 of the adapter 330 may be retrieved to the container body 610, etc.

Next, when the retrieving operation of the process fluid using the residue retrieving air pump 360 is completed, the controller 540 may cause the second container support 311 to be pivoted from the supporting position to the container separation location, and the container body 610 may be dropped down into the container collecting box 320, etc.

Figure 11:
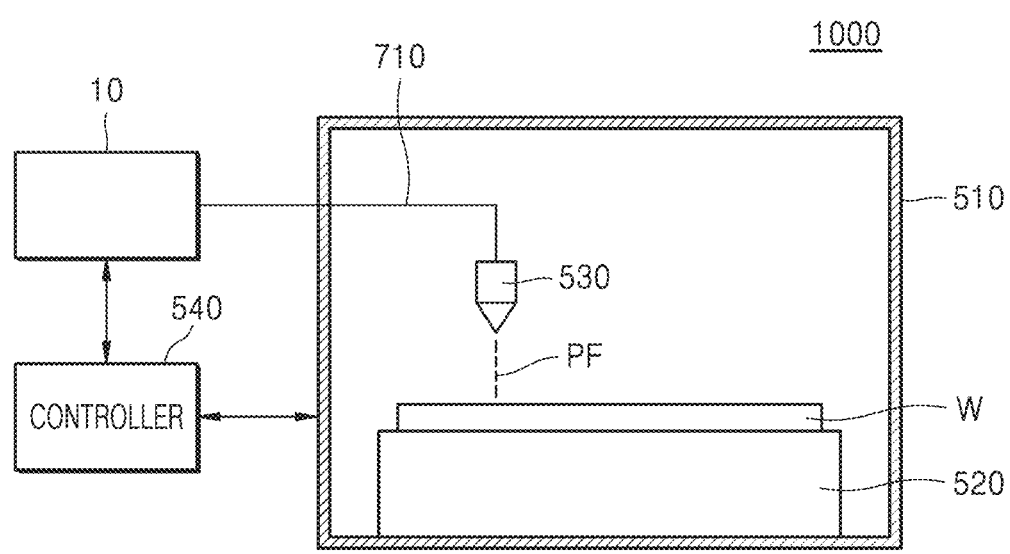
FIG. 11 is a schematic diagram of a substrate processing apparatus according to some example embodiments.

FIG. 11 is a schematic diagram of a substrate processing apparatus 1000 according to some example embodiments.

Referring to FIG. 11, the substrate processing apparatus 1000 may include the process chamber 510, a substrate stage 520, an injection nozzle 530, the fluid supply apparatus 10, and/or the controller 540, etc., but is not limited thereto. The substrate stage 520 may be provided in the process chamber 510 and may mount a substrate W (e.g., a semiconductor substrate, etc.), which is an object to be processed. The substrate W may include, for example, a semiconductor wafer, a printed circuit board (PCB), etc. The injection nozzle 530 may receive a process fluid PF and/or process gas from the fluid supply apparatus 10 through the fluid supply line 710. The injection nozzle 530 may be provided to inject the process fluid PF toward the substrate W mounted on the substrate stage 520. The controller 540 may be configured to control overall operations of the substrate process apparatus 1000, such as a fluid supply process using the fluid supply apparatus 10, a substrate processing process using the supplied process fluid PF, etc.

According to some example embodiments, the substrate processing apparatus 1000 may be configured to perform a flux coating process by which a flux is coated on the substrate W. In this case, a container accommodating the flux may be loaded on the fluid supply apparatus 10, the fluid supply apparatus 10 may provide the flux to the injection nozzle 530, and the injection nozzle 530 may inject the flux on a predetermined area of the substrate W. According to some example embodiments, the substrate processing apparatus 1000 may be configured to perform a solder ball attachment process for attaching a solder ball on a landing pad of the substrate W, but the example embodiments are not limited thereto. The solder ball attachment process may include a flux coating process for coating a flux on the substrate W and a ball attachment process for attaching a solder ball on the flux, but the example embodiments are not limited thereto.

FIG. 12 is a flowchart of a substrate processing method according to some example embodiments. Hereinafter, an example substrate processing method using the fluid supply apparatus 10 and the substrate processing apparatus 1000 including the fluid supply apparatus 10 is described with reference to FIGS. 1 through 11, but the example embodiments are not limited thereto, and for example, comparable alternative architectures may be used.

First, the plurality of containers 600 may be loaded onto the loading box 110 of the container supply module 100 (S110). In a state in which the outlet 110o of the loading box 110 is closed by the lower stopper 120, the plurality of containers 600 may be provided to the inlet 110i of the loading box 110. When the plurality of containers 600 are loaded in the loading box 110, the controller 540 may control the actuator 131 to move the upper stopper 130 such that the upper stopper 130 may close a passage between the middle loading space 111M and the lower loading space 111L, etc.

Next, the controller 540 may control the container supply module 100 such that at least one container 600 is loaded onto the first container support 211 of the cap separation module 200 (S120). In more detail, after moving the loading box 110 such that the outlet 110o of the loading box 110 is aligned on the first container support 211 vertically (for example, in a Z direction), the controller 540 may cause the first container support 211 to ascend from an initial location so as to support the container 600 accommodated in the lower loading space 111L of the loading box 110, etc. When the container 600 is supported by the first container support 211, the controller 540 may control the first container support 211 to descend to the initial location.

Next, the controller 540 may control the cap separation module 200 to separate the nozzle cap 620 from the container body 610 (S130). As described above with reference to FIGS. 7A through 7C, in a state in which the nozzle cap 620 is clamped by the clamping bodies 221, the container body 610 may be rotated, and thus, a screw joint between the container body 610 and the nozzle cap 620 may be released. The nozzle cap 620 separated from the container body 610 may be collected and/or retrieved by the cap collecting box 240 provided below the clamping bodies 221.

After separating the nozzle cap 620 from the container body 610, the controller 540 may control the transportation robot 730 and cause the transportation robot 730 to transport the container body 610 from the first container support 211 of the cap separation module 200 to the second container support 311 of the fluid supply module 300 (S140).

After controlling the transportation robot 730 to mount the container body 610 on the second container support 311, the controller 540 may control the second container support 311 to cause the process fluid and/or process gas contained in the container body 610 to be provided to the injection nozzle 530 in the process chamber 510 through the fluid supply line 710 (S150), and the injection nozzle 530 may inject the process fluid and/or process gas provided through the fluid supply line 710 onto the substrate W (S160).

For example, as described above with reference to FIG. 10A, in order for the process fluid and/or process gas stored in the container body 610 to be provided to the injection nozzle 530, the on-off valve 373 may be positioned in the open position, and then, the plunger 630 may be pressed by using the plunger actuator 350. When the plunger 630 is pressed, the process fluid in the container body 610 may be discharged to the fluid supply line 710 and may be provided to the injection nozzle 530 through the fluid supply line 710.

Next, after the process fluid in the container body 610 is exhausted, the process fluid remaining in the adapter 330 may be retrieved from the container body 610 (S170). As described above with reference to FIG. 10B, after locating the on-off valve 373 in the closed position so that the fluid passage in the fluid supply line 710 is closed, the controller 540 may cause pneumatic pressure RA to be provided to the second fluid passage 333 of the adapter 330 by controlling the residue retrieving air pump 360, and thus, the process fluid remaining in the adapter 330 may be retrieved from the container body 610, etc.

After the retrieval of the process fluid remaining in the adapter 330 is completed, the controller 540 may cause the container body 610 to be unloaded from the second container support 311 (S180). For example, the container body 610 may be retrieved from the container collecting box 320 provided below the second container support 311, etc.

According to some example embodiments, a series of processes required for providing the process fluid and/or process gas accommodated in and/or stored in the container 600 to the process chamber 510, for example, supplying of the container 600, separation of the nozzle cap 620, discharging of the process fluid in the container 600 to the fluid supply line 710, etc., may be automated (e.g., controlled by the controller 540), etc.

Also, according to some example embodiments, the residue of the process fluid remaining in the adapter 330 may be retrieved by the container body 610, and thus, the contamination of the adapter 330 may be reduced, restricted, and/or prevented, and therefore a preventive check-up cycle of the facility may be increased, and/or an operation rate of the facility may be increased.

While various example embodiments of the inventive concepts have been particularly shown and described with reference to some example embodiments thereof, it will be understood that various changes in form and details may be made therein without departing from the spirit and scope of the following claims.

What is claimed is:

1. A fluid supply apparatus comprising:
    a container supply holder configured to supply a container to a cap separator using a loading box, the container including a detachable nozzle cap, and configured to store a process fluid;
    a cap separator configured to receive the container from the loading box and separate the nozzle cap from a container body of the container using a cap clamper and a rotation actuator, the cap clamper configured to clamp and hold the nozzle cap, and the rotation actuator configured to rotate the container body;
    a fluid supplier configured to supply the process fluid contained in the container body through a fluid supply line; and
    a controller configured to control the container supply holder, the cap separator, and the fluid supplier.

2. The fluid supply apparatus of claim 1, wherein
    the loading box defines an upper loading space, a middle loading space, and a lower loading space, the upper loading space having a first horizontal width;
    the lower loading space having a second horizontal width which is less than the first horizontal width;
    the middle loading space extending between the upper loading space and the lower loading space, wherein a horizontal width of the middle loading space is decreases towards the lower loading space; and
    the container supply holder further comprises,
        a lower stopper configured to open or close an outlet of the loading box, and
        an upper stopper configured to open or close a passage between the upper loading space and the lower loading space of the loading box.

3. The fluid supply apparatus of claim 1, wherein
    the nozzle cap is fixed onto the container body by a screw joint; and
    the controller is configured to control the cap clamper to clamp the nozzle cap, and control the rotation actuator to rotate the container body in a first rotation direction which causes the nozzle cap to be separated from the container body.

4. The fluid supply apparatus of claim 1, wherein the cap clamper includes:
    at least one clamping body configured to clamp and hold the nozzle cap; and
    a linear moving block coupled to the clamping body, the linear moving block configured to linearly move along a linear movement guide.

5. The fluid supply apparatus of claim 4, wherein the cap clamper further includes:
    a stopper included at a first end of the linear movement guide; and
    an elastic member included at a second end of the linear movement guide, the elastic member configured to provide a restoring force to the linear moving block in a direction from the second end of the linear movement guide to the first end of the linear movement guide.

6. The fluid supply apparatus of claim 1, wherein
    the cap separator further includes a tag reader, the tag reader configured to recognize an identification tag included on the container body.

7. The fluid supply apparatus of claim 1, wherein
    the cap clamper further includes a cap collecting box configured to collect the nozzle cap separated from the container body.

8. The fluid supply apparatus of claim 1, wherein
    the fluid supplier further includes a rear end frame and an actuator;
    the rear end frame is configured to support the container body; and
    the actuator is configured to press the rear end frame so that the rear end frame is fixed to a second end portion of the container body.

9. The fluid supply apparatus of claim 1, wherein
    the container body includes a plunger;
    the fluid supplier further includes a rear end frame and a plunger actuator;
    the rear end frame includes a pneumatic channel; and
    the plunger actuator includes an air pump configured to provide pneumatic pressure to the plunger included in the container body through the pneumatic channel of the rear end frame.

10. The fluid supply apparatus of claim 1, wherein
    the fluid supplier further includes an adapter including a first fluid passage, the adapter configured to support a first end portion of the container body; and
    the fluid supplier further includes a first check valve included in the fluid supply line, the first check valve configured to restrict the process fluid in the fluid supply line from flowing backwards to the adapter.

11. The fluid supply apparatus of claim 10, wherein the fluid supplier further includes:
    a residue retrieving air pump configured to provide pneumatic pressure to a second fluid passage of the adapter so that the process fluid remaining in the first fluid passage of the adapter is retrieved from the container body; and
    a second check valve included on a pneumatic pressure supply line connected between the residue retrieving air pump and the second fluid passage of the adapter, the second check valve configured to restrict the process fluid from flowing toward the residue retrieving air pump.

12. The fluid supply apparatus of claim 11, further comprising:
    an on-off valve included on the fluid supply line and configured to open or close a fluid passage in the fluid supply line, wherein, the controller is further configured to control the residue retrieving air pump to allow the process fluid remaining in the first fluid passage of the adapter to be retrieved from the container body, by providing the pneumatic pressure to the second fluid passage of the adapter, while the on-off valve is closed.

13. The fluid supply apparatus of claim 1, further comprising:
a transportation robot configured to transport the container body between a first container support of the container supply holder and a second container support of the fluid supplier, the first container support configured to support the container, the second container support configured to support the container.

14. The fluid supply apparatus of claim 1, wherein
the fluid supplier further comprises a container collecting box provided below a second container support and configured to collect the container body; and
the second container support is further configured to pivot between a supporting position to support the container body and a container separation position to drop the container body into the container collecting box.

15. A fluid supply apparatus comprising:
a container support configured to support a container, the container including a container body and a detachable nozzle cap, the container body configured to contain a process fluid, and the nozzle cap coupled to a front end portion of the container body, the front end portion of the container body having a nozzle portion;
an adapter configured to support the front end portion of the container body, the adapter including a first fluid passage and a second fluid passage, the first fluid passage extending between the nozzle portion of the container body and an outlet connected to a fluid supply line, and the second fluid passage connected to the first fluid passage;
a rear end frame configured to support a rear end portion of the container body;
a plunger actuator configured to press a plunger included in the container body; and
a residue retrieving air pump configured to provide pneumatic pressure to the second fluid passage of the adapter such that the process fluid remaining in the first fluid passage of the adapter is retrieved from the container body.

16. The fluid supply apparatus of claim 15, wherein
the rear end frame includes a pneumatic channel; and
the plunger actuator includes an air pump configured to provide pneumatic pressure to the pneumatic channel of the rear end frame.

17. The fluid supply apparatus of claim 15, further comprising:
a first check valve included on the fluid supply line, the first check valve configured to restrict the process fluid in the fluid supply line from flowing backwards to the adapter;
an on-off valve included on the fluid supply line, the on-off valve configured to open or close a fluid passage in the fluid supply line; and
a second check valve included on a pneumatic pressure supply line extending between the residue retrieving air pump and the second fluid passage of the adapter, the second check valve configured to restrict the process fluid from flowing toward the residue retrieving air pump.

18. The fluid supply apparatus of claim 17, wherein
while the on-off valve is closed, the residue retrieving air pump is configured to provide the pneumatic pressure to the second fluid passage of the adapter, which causes the process fluid remaining in the first fluid passage of the adapter to be retrieved from the container body.

19. The fluid supply apparatus of claim 15, further comprising:
a shaft, the container support mounted on the shaft and pivotable around the shaft;
a rack gear configured to be linearly moved by an actuator;
a pinion gear provided on an outer circumferential surface of the shaft and configured to be rotated in gear with the rack gear; and
a container collecting box provided below the container support and configured to collect the container body.

20. A substrate processing apparatus comprising:
a substrate stage configured to receive a substrate;
an injection nozzle configured to inject a process fluid onto the substrate received on the substrate stage; and
a fluid supply apparatus connected to the injection nozzle through a fluid supply line, the fluid supply apparatus configured to supply the process fluid through the injection nozzle,
the fluid supply apparatus including,
a container supply holder configured to supply a container to a cap separator using a loading box, the container including a detachable nozzle cap, and configured to store a process fluid,
a cap separator configured to receive the container from the loading box and separate the nozzle cap from a container body of the container using a cap clamper and a rotation actuator, the cap clamper configured to clamp and hold the nozzle cap, and the rotation actuator configured to rotate the container body,
a fluid supplier configured to supply the process fluid contained in the container body through a fluid supply line, and
a controller configured to control the container supply holder, the cap separator, and the fluid supplier.

* * * * *